United States Patent
Ludwig

(10) Patent No.: US 10,230,016 B2
(45) Date of Patent: *Mar. 12, 2019

(54) COLOR IMAGING USING ARRAY OF WAVELENGTH-SELECTIVE OPTOELECTRONIC ELEMENTS AS LIGHT-FIELD IMAGE OR SENSOR

(71) Applicant: NRI R&D PATENT LICENSING, LLC, San Antonio, TX (US)

(72) Inventor: Lester F. Ludwig, San Antonio, TX (US)

(73) Assignee: NRI R&D PATENT LICENSING, LLC, San Antonio, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/676,749

(22) Filed: Aug. 14, 2017

(65) Prior Publication Data

US 2017/0373214 A1 Dec. 28, 2017

Related U.S. Application Data

(63) Continuation of application No. 13/072,588, filed on Mar. 25, 2011, now Pat. No. 9,735,303.
(Continued)

(51) Int. Cl.
*H01L 31/105* (2006.01)
*H04N 9/04* (2006.01)
(Continued)

(52) U.S. Cl.
CPC .......... *H01L 31/105* (2013.01); *H04N 9/045* (2013.01); *H01L 27/146* (2013.01); *H01L 27/3211* (2013.01); *H01L 51/5036* (2013.01)

(58) Field of Classification Search
CPC . H01L 31/105; H01L 27/146; H01L 27/3211; H01L 51/5036; H04N 9/045
See application file for complete search history.

(56) References Cited

U.S. PATENT DOCUMENTS 5,932,895 A 8/1999 Shen et al.
6,486,974 B1 11/2002 Nakai et al.
(Continued)

*Primary Examiner* — Peter D McLoone
(74) *Attorney, Agent, or Firm* — Procopio, Cory, Hargreaves & Savitch LLP

(57) ABSTRACT

Light-sensor array systems for capturing multiple-color images and light-fields using array of wavelength-selective optoelectronic elements (rather than wider-range photosensors prefaced with visible-band wavelength-selective optical elements such as color selective filters) as light-field or image sensors are presented. The light-sensor array can be one or more of transparent, bendable, and implemented on a curved surface. In some embodiments, the wavelength-selective light-sensing opto-electronic elements are arranged in a stacked array. In some embodiments, more than three wavelength-selective ranges can be employed in each light-sensing pixel. The invention can be used to implement one or more of a lensless imaging light-field camera, tactile gesture user interface, and/or proximate gesture user interface. In some embodiments, the light-sensor array system can be configured to emit light of one or more colors, and thus can additionally serve as an image display. In some embodiments, the wavelength-selective light-sensing opto-electronic elements are co-optimized for light sensing and emission.

21 Claims, 21 Drawing Sheets

Related U.S. Application Data

(60) Provisional application No. 61/341,011, filed on Mar. 25, 2010.

(51) Int. Cl.
*H01L 27/146* (2006.01)
*H01L 27/32* (2006.01)
*H01L 51/50* (2006.01)

(56) References Cited

U.S. PATENT DOCUMENTS

| | | |
|---|---|---|
| 7,170,046 B2 | 1/2007 | Higashitsutsumi |
| 7,170,606 B2 | 1/2007 | Yerazunis |
| 7,471,843 B2 | 12/2008 | Messing et al. |
| 7,518,381 B2 | 4/2009 | Lamborghini et al. |
| 7,598,949 B2 | 10/2009 | Han |
| 7,773,136 B2 | 8/2010 | Ohyama et al. |
| 7,816,638 B2 | 10/2010 | Olson et al. |
| 7,821,552 B2 | 10/2010 | Suzuki |
| 7,830,561 B2 | 11/2010 | Zomet et al. |
| 8,018,509 B2 | 9/2011 | Numata |
| 8,076,630 B2 | 12/2011 | Schowengerdt et al. |
| 8,125,559 B2 | 2/2012 | Ludwig |
| 8,138,466 B2 | 3/2012 | Hosaka |
| 8,816,263 B2 | 8/2014 | Ludwig |
| 8,830,375 B2 | 9/2014 | Ludwig |
| 8,848,047 B2 | 9/2014 | Inuiya et al. |
| 9,591,239 B2 | 3/2017 | Toda et al. |
| 2004/0125053 A1 | 7/2004 | Fujisawa |
| 2004/0247484 A1 | 12/2004 | Yerazunis |
| 2005/0133690 A1 | 6/2005 | Higashitsutsumi |
| 2005/0169551 A1 | 8/2005 | Messing et al. |
| 2005/0230600 A1 | 10/2005 | Olson et al. |
| 2006/0086896 A1 | 4/2006 | Han |
| 2006/0177212 A1 | 8/2006 | Lamborghini et al. |
| 2007/0081200 A1 | 4/2007 | Zomet et al. |
| 2007/0146512 A1 | 6/2007 | Suzuki et al. |
| 2007/0183657 A1 | 8/2007 | Kidono et al. |
| 2007/0187794 A1 | 8/2007 | Fukuyoshi et al. |
| 2008/0049115 A1 | 2/2008 | Ohyama et al. |
| 2008/0079806 A1 | 4/2008 | Inuiya et al. |
| 2008/0231564 A1 | 9/2008 | Harada et al. |
| 2008/0283729 A1 | 11/2008 | Hosaka |
| 2009/0040205 A1 | 2/2009 | Scheibe |
| 2009/0290034 A1 | 11/2009 | Ludwig |
| 2010/0208240 A1 | 8/2010 | Schowengerdt et al. |
| 2010/0283866 A1 | 11/2010 | Numata |
| 2011/0032369 A1 | 2/2011 | Ludwig |
| 2011/0243430 A1 | 10/2011 | Hung et al. |
| 2012/0069209 A1 | 3/2012 | Gudlavalleti et al. |
| 2012/0267512 A1 | 10/2012 | Ludwig |
| 2015/0201136 A1 | 7/2015 | Toda et al. |

From http://en.wikipedia.org/wiki/Band_gap (Pieter Kuiper) (visited 03/22/11)

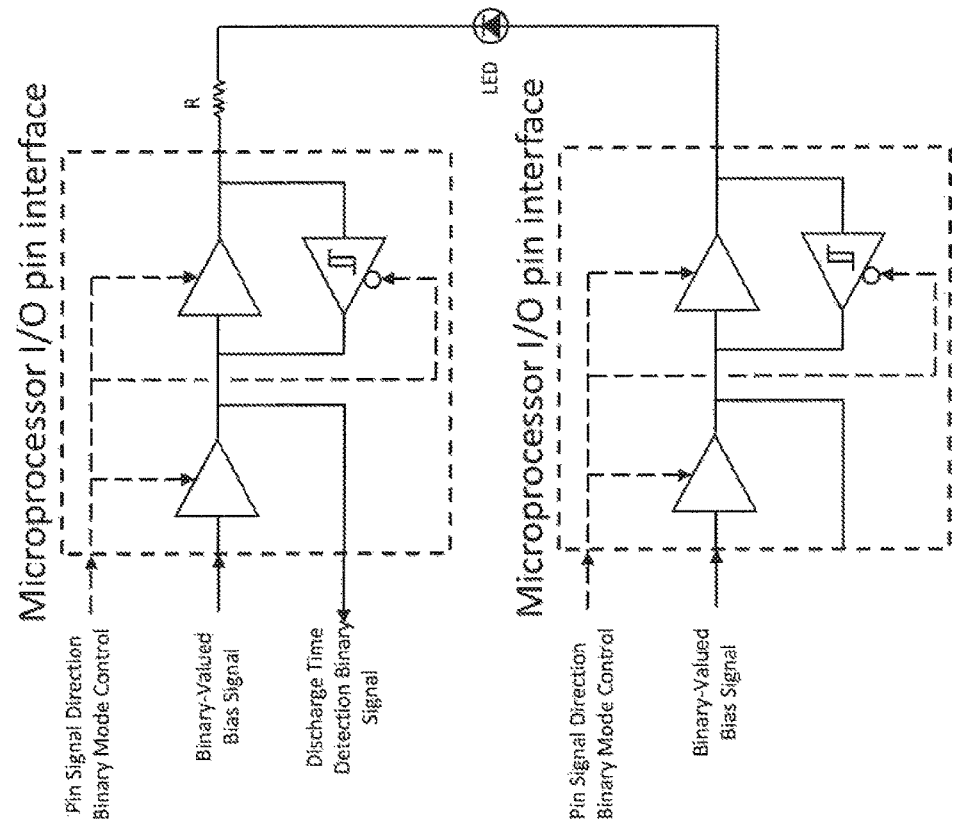
Figure 3a —Prior Art—
Figure 3b —Prior Art—
Figure 3c —Prior Art—
Figure 3d —Prior Art—

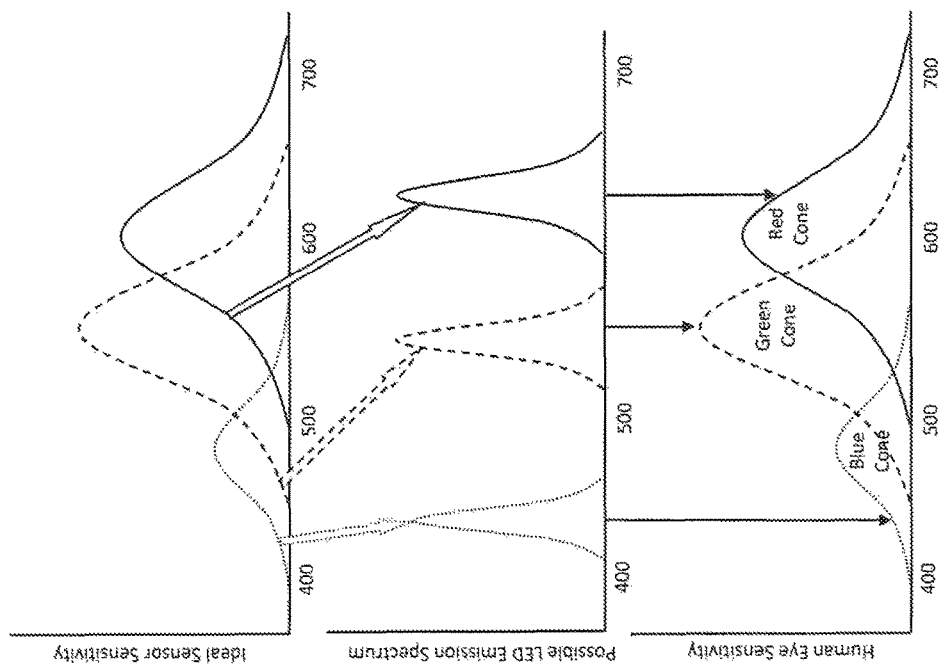
—Prior Art—
Figure 4a
—Prior Art—
Figure 4c
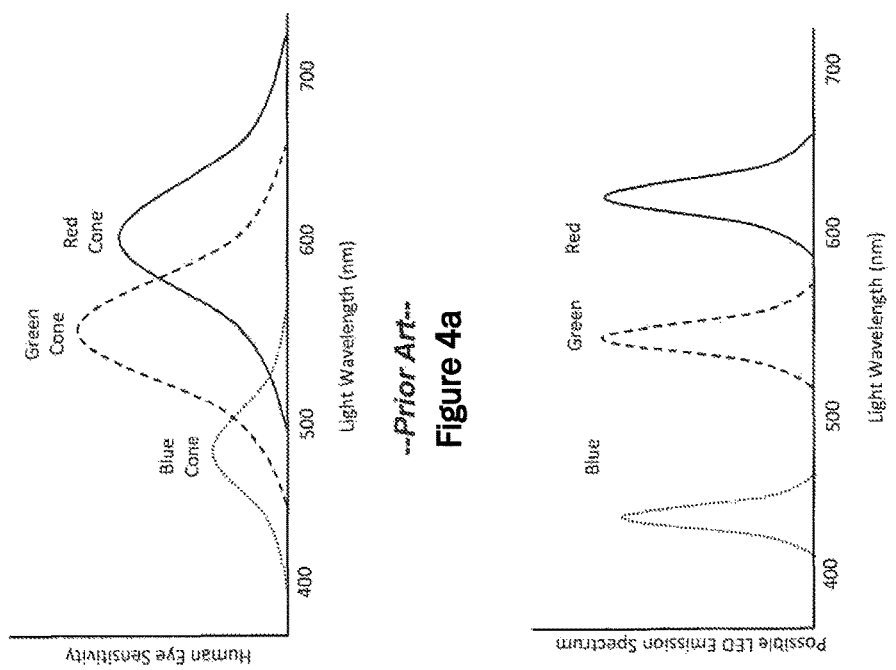
—Prior Art—
Figure 4b

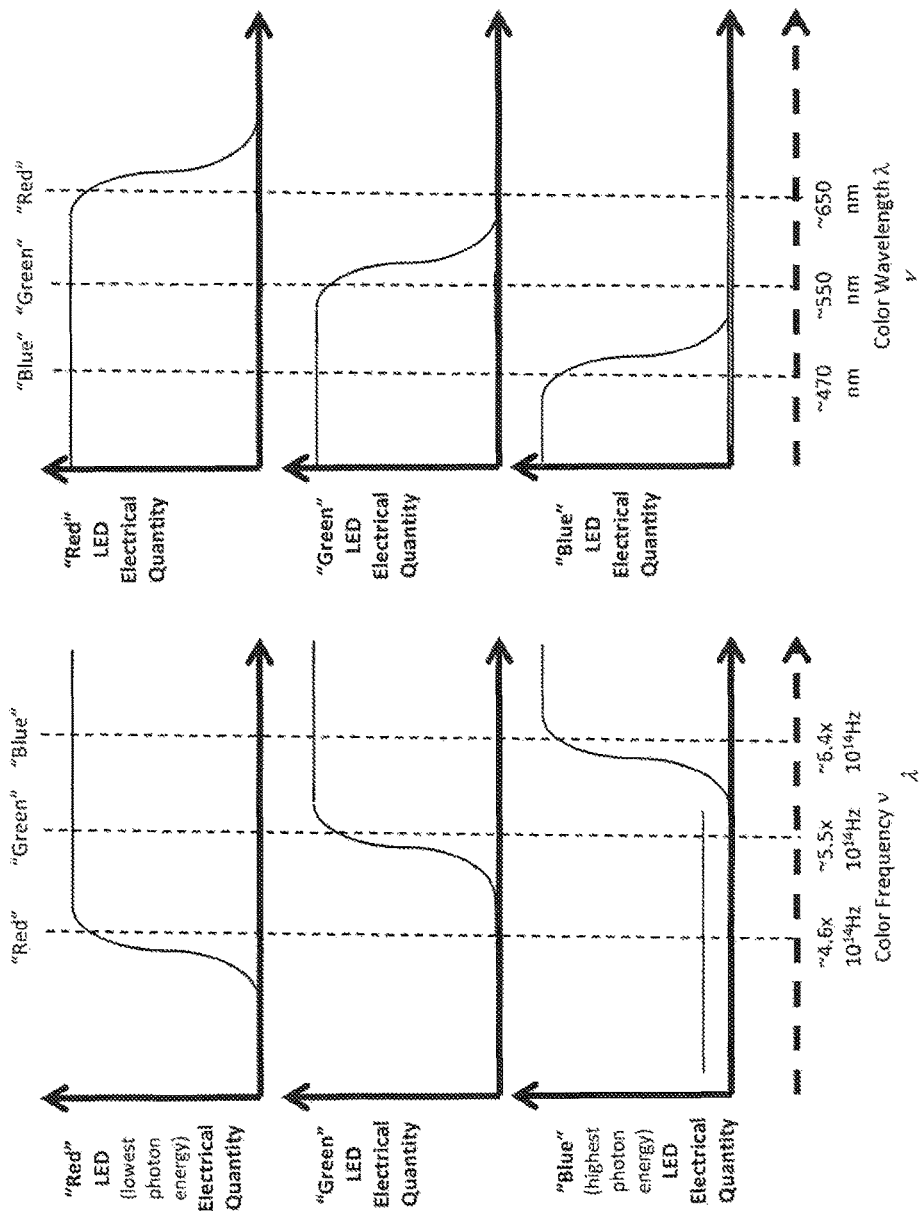

Adapted from G. Gu, G. Parthasarathy, P. Burrows, T. Tian, I. Hill, A. Kahn, S. Forrest. "Transparent stacked organic light emitting devices. I. Design principles and transparent compound electrodes," *Journal of Applied Physics*, October 1999, vol. 86 no. 8, pp.4067-4075.

Adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp.4067-4075.

Conventional RGB Stripe Arrangement

PenTile Matrix™

These adapted from http://www.displayblog.com/2009/03/26/samsung-oled-pentile-matrix-next-iphone-oled-display/ (visited 03/23/11)

COLOR IMAGING USING ARRAY OF
WAVELENGTH-SELECTIVE
OPTOELECTRONIC ELEMENTS AS
LIGHT-FIELD IMAGE OR SENSOR

CROSS-REFERENCE TO RELATED
APPLICATION(S)

This application is a continuation application of U.S. application Ser. No. 13/072,588, filed on Mar. 25, 2011, which claims the benefit of U.S. Provisional Application No. 61/341,011, filed Mar. 25, 2010, the disclosures of each of which are hereby incorporated herein in their entireties by reference.

BACKGROUND

The invention pertains to the use of arrays of color LEDs as color light-field image sensors.

DESCRIPTION OF THE RELATED ART

Light detection is typically performed by photosite CCD (charge-coupled device) elements, phototransistors, CMOS photodetectors, and photodiodes. Photodiodes are often viewed as the simplest and most primitive of these, and typically comprise a PIN (P-type/intrinsic/N-type) junction rather than the more abrupt PIN (P-type/N-type) junction of conventional signal and rectifying diodes.

However, virtually all diodes exhibit some degree of photovoltaic properties. In particular, LEDs, which are diodes that have been structured and doped for specific types of optimized light emission, can also behave (with at least low-to moderate performance) as photodiodes. In popular circles, Forrest M. Mims has often been credited as calling attention to the fact that that a conventional LED can be used as a photovoltaic light detector as well as a light emitter, see, for example, Mims III, Forrest M. "Sun Photometer with Light-emitting diodes as spectrally selective detectors". Applied Optics. Vol. 31, No. 33, Nov. 20, 1992, incorporated herein by reference. It was further shown that as photodetectors, LEDs exhibit spectral selectivity associated with the LED's emission wavelength. More generally, LEDs, organic LEDs ("OLEDs"), organic field effect transistors, and other related devices exhibit a range of readily measurable photoresponsive electrical properties, such as photocurrents and related photovoltages and accumulations of charge in the junction capacitive structure of the LED.

What is needed are novel systems and methods for leveraging the aforesaid properties of LEDs for light detection.

SUMMARY

The invention pertains to the use of arrays of color inorganic LEDs, OLEDs, or related devices for use as a color light-field image sensor.

In accordance with an aspect of the inventive concept, there is provided a color light field sensor employing at least three inorganic LEDs, OLEDs, or related devices of differing emission colors to create respectively associated light amplitude measurement signals, producing a first output signal by subtracting a function of the light amplitude measurement signal associated with the mid-value wavelength LED from a function the light amplitude measurement signal associated with the lowest-value wavelength LED, producing a second output signal by subtracting a function of the light amplitude measurement signal associated with the highest-value wavelength LED from a function the light amplitude measurement signal associated with the mid-value wavelength LED, and producing a third output by taking a function of the light amplitude measurement signal associated with the highest-value wavelength LED. In accordance with another aspect of the inventive concept, there is provided a method for implementing a color light field sensor. The inventive method involves: receiving light from a light field, the received light comprising a color composition and an amplitude distribution; applying at least a portion of the received light to at least three LEDs of differing emission colors to create respectively associated light amplitude measurement signals, the emission colors comprising a lowest-value wavelength, a highest-value wavelength, and at least one mid-value wavelength having wavelength value between the lowest-value wavelength and the highest-value wavelength; producing a first output signal by subtracting a first function of the light amplitude measurement signal associated with the mid-value wavelength LED from a function of the light amplitude measurement signal associated with the lowest-value wavelength LED; producing a second output signal by subtracting a second function of the light amplitude measurement signal associated with the highest-value wavelength LED from a function of the light amplitude measurement signal associated with the mid-value wavelength LED; and producing a third output by taking a third function of the light amplitude measurement signal associated with the highest-value wavelength LED. In the inventive method, the first output signal, second output signal, and third output signal are responsive to the color composition and amplitude distribution of received light.

In accordance with yet another aspect of the inventive concept, there is provided a color light field sensor, incorporating a light receiver for receiving light from a light field, the received light comprising color composition and amplitude distribution; at least three LEDs of differing emission colors operable to absorb at least a portion of the received light and to create respectively associated light amplitude measurement signals, the emission colors comprising a lowest-value frequency, a highest-value frequency, and at least one mid-value frequency having frequency-value between the lowest-value frequency and the highest-value frequency; and a processing unit. The processing unit is configured to produce a first output signal by subtracting a first function of the light amplitude measurement signal associated with the mid-value frequency LED from a function of the light amplitude measurement signal associated with the lowest-value frequency LED; produce a second output signal by subtracting a second function of the light amplitude measurement signal associated with the highest value frequency LED from a function of the light amplitude measurement signal associated with the mid-value frequency LED; and produce a third output by taking a third function of the light amplitude measurement signal associated with the highest value frequency LED. The first output signal, second output signal, and third output signal are responsive to the color composition and amplitude distribution of received light.

In accordance with yet another aspect of the inventive concept, there is provided a display device having a color light field sensor capability. The inventive display device incorporates an array of LEDs; a control logic operable to drive the array of LEDs; and a light receiver for receiving light from a light field, the received light comprising color composition and amplitude distribution. The aforesaid array of LED includes at least three LEDs of differing emission colors operable to absorb at least a portion of the received light and to create respectively associated light amplitude measurement signals, the emission colors comprising a lowest-value frequency, a highest-value frequency, and at least one mid-value frequency having frequency value between the lowest-value frequency and the highest-value frequency. The inventive display device further comprises a processing unit for: producing a first output signal by subtracting a first function of the light amplitude measurement signal associated with the mid-value frequency LED from a function of the light amplitude measurement signal associated with the lowest-value frequency LED; producing a second output signal by subtracting a second function of the light amplitude measurement signal associated with the highest-value frequency LED from a function of the light amplitude measurement signal associated with the mid-value frequency LED; and producing a third output by taking a third function of the light amplitude measurement signal associated with the highest-value frequency LED. In the inventive display device, the first output signal, second output signal, and third output signal are responsive to the color composition and amplitude distribution of received light.

In an embodiment, an ultraviolet filter can be used to block shorter wavelength ultraviolet light from the inorganic LEDs, OLEDs, or related devices.

In an embodiment, additional sensor colors can be added via minor variations to dopings or inks used in fabricating red, green, and blue inorganic LED, OLED, or related device elements.

In an embodiment, the additional sensor colors can be used to obtain close approximations to the spectral sensitivities of the red, green, and blue cones of human vision. The resulting arrangement can be used to implement a high-precision color sensing system.

In an embodiment, the signals closely approximating the spectral sensitivities of the red, green, and blue cones of human vision can be used to drive red, green, and blue light emissions for color inorganic LEDs, OLEDs, or related devices in a three-color display.

In an embodiment, the at least three inorganic LEDs, OLEDs, or related devices are arranged in an array.

In an embodiment, at least three inorganic LEDs, OLEDs, or related devices are transparent.

In an embodiment, the at least three transparent inorganic LEDs, OLEDs, or related devices are comprised in an array that is overlaid on a display such as an LCD.

In an embodiment, at least three inorganic LEDs, OLEDs, or related devices are comprised by transparent SOLED structures to form a color transparent light sensor.

In an embodiment, an array of color inorganic LEDs, OLEDs, or related devices, together with associated signal processing aspects of the invention, can be adapted to function as both a color image display and color light-field sensor compatible with synthetic optics image formation algorithms using methods, systems, and process such as those described in pending U.S. patent application Ser. No. 12/419,229, U.S. Patent Application Publication No. 2009/0231474 and in U.S. Patent Application Publication No. 2009/0290034. In an embodiment, an array of color inorganic LEDs, OLEDs, or related devices, together with associated signal processing aspects of the invention, can be used to implement a tactile user interface sensor In an embodiment, an array of color inorganic LEDs, OLEDs, or related devices, together with associated signal processing aspects of the invention, can be adapted to function as both an image display and light-field sensor which can be used to implement a proximate image user interface.

In an embodiment, an array of color inorganic LEDs, OLEDs, or related devices, together with associated signal processing aspects of the invention, can be adapted to function as both a color image display and color light-field sensor which can be used to implement a tactile user interface sensor.

In an embodiment, an array of color inorganic LEDs, OLEDs, or related devices, together with associated signal processing aspects of the invention, can be adapted to function as both an image display and light-field sensor which can be used to implement a proximate image user interface sensor.

In an embodiment, an array of color inorganic LEDs, OLEDs, or related devices, together with associated signal processing aspects of the invention, can be adapted to function as both an image display and light-field sensor which can be used to implement a gesture user interface sensor, lensless imaging camera, and visual image display.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The above and other aspects, features and advantages of the present invention will become more apparent upon consideration of the following description of preferred embodiments taken in conjunction with the accompanying drawing figures, wherein:

FIGS. 3a-d depict various exemplary circuits demonstrating various exemplary approaches to detecting light with an LED.

FIG. 4a depicts an exemplary representation of human eye sensitivity to the spectrum of wavelengths of visible light.

FIG. 4b depicts an exemplary positioning of three narrow pass-band s in portions of the visible spectrum near peaks of the cone responses and away from areas of significant spectral overlap.

FIG. 4c depicts an exemplary arrangement of red, green, and blue LED emission spectra of FIG. 4b as driven by measurements of energy in each of the red, green, and blue pass-bands of FIG. 4a.

FIG. 6a depicts the resulting cascading 'turn-on' effect for a given red, green, and blue LED as light frequency, and hence light photon energy, increases from left-to-right (corresponding to inversely proportional light wavelength decreasing from left-to-right).

FIG. 6b depicts the resulting cascading 'turn-on' effect for a given red, green, and blue LED as light wavelength increases from left-to-right (corresponding to inversely proportional light frequency and light photon energy decreasing from left-to right).

DETAILED DESCRIPTION

In the following detailed description, reference will be made to the accompanying Figure(s), in which identical functional elements are designated with like numerals. The aforementioned accompanying Figures show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

The relationship between the spectral detection band and the spectral emission bands of each of a plurality of colors and types of color inorganic LEDs, OLEDs, and related devices can be used to create a color light-field sensor from, for example, a color inorganic LED, OLED, and related device. Such an arrangement was described in U.S. Patent Application Publication No. 2009/0290034.

Color inorganic LED array displays are currently employed in "LED TV" products and road-side and arena color-image LED advertising signs. Color OLED array displays have begun to appear in cellphones (such as those from Samsung and others). Color OLED array displays are of particular interest because:

OLEDs can be fabricated (along with associated electrical wiring conductors) via printed electronics on a wide variety of surfaces such as glass, Mylar, plastics, paper, etc.;

Leveraging some such surface materials, OLEDs can be readily bent, printed on curved surfaces, etc.

OLEDs can be made transparent (and be interconnected with transparent conductors); and Leveraging such transparency, OLEDs can be:
Stacked vertically,
Used as an overlay element atop an LCD or other display, and
Used as an underlay element between an LCD an its associated backlight.

The aforesaid U.S. Patent Application Publication No. 2009/0290034 additionally teaches how such a light-field sensor can be used together with signal processing software to implement lensless-imaging camera technology, and how such technology can be used to create an integrated camera/display device which can be used, for example, to deliver precise eye-contact in video conferencing applications.

Figure 1A:
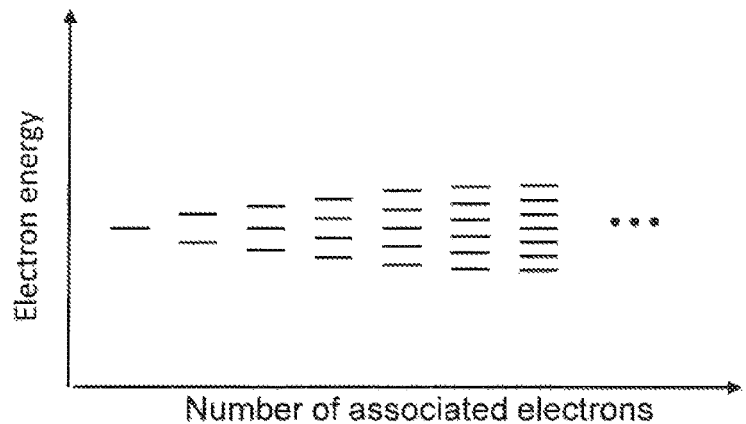
Figure 1a depicts a representation of the spread of electron energy levels as a function of the number of associated electrons in a system such as a lattice of semiconducting material resultant from quantum state exclusion processes. (The relative positions vertically and from column-to-column are schematic and not to scale, and electron pairing effects are not accurately represented.)

FIG. 1a depicts a representation of the spread of electron energy levels as a function of the number of associated electrons in a system such as a lattice of semiconducting material resultant from quantum state exclusion processes. As the number of associated electrons in a system increases, the separation between consecutive energy levels decreases, in the limit becoming an effective continuum of energy levels. Higher energy level electrons form a conduction band while lower energy electrons lie in a valence band. The relative positions vertically and from column-to-column are schematic and not to scale, and electron pairing effects are not accurately represented.

Figure 1B:
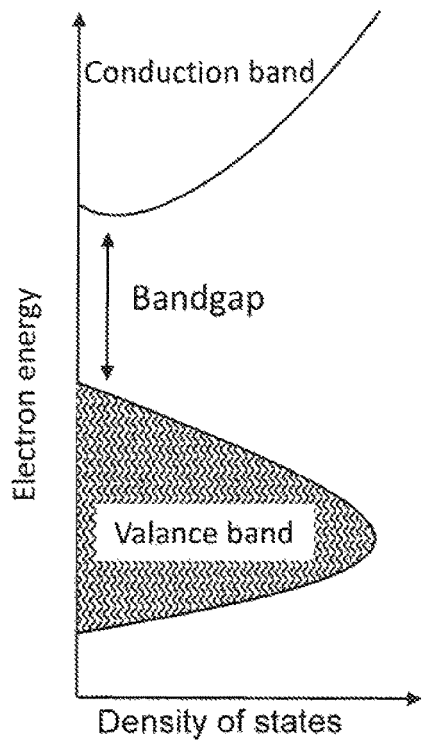
FIG. 1b depicts the how the energy distribution of electrons in the valance band and conduction band vary as a function of the density of electron states, and the resultant growth of the band gap as the density of electron states increases. (Adapted from Pieter Kuiper, http://en.wikipedia.org/wiki/Band_gap, visited Mar. 22, 2011.)

FIG. 1b (dapted from Pieter Kuiper, http://en.wikipedia.org/wiki/Band_gap, visited Mar. 22, 2011) depicts how the energy distribution of electrons in the valance band and conduction band varies as a function of the density of electron states, and the resultant growth of the band gap as the density of electron states increases. The "band gap" is the difference in energy between electrons at the top of the valence band and electrons at the bottom of the conduction band.

Figure 1C:
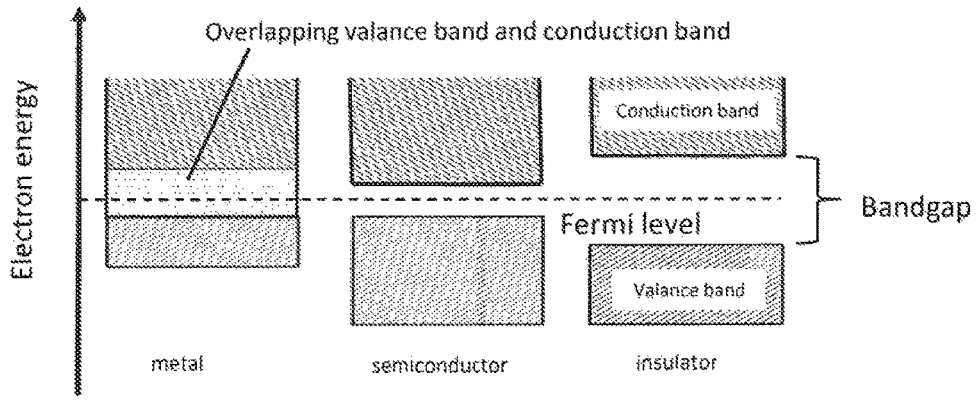
FIG. 1c depicts an exemplary (albeit not comprehensive) schematic representation of the relationships between valance bands and conduction bands in materials distinctly classified as metals, semiconductors, and insulators. (Adapted from Pieter Kuiper, http://en.wikipedia.org/wiki/Electronic_band_structure, visited Mar. 22, 2011.)

FIG. 1c (a dapted from Pieter Kuiper, http://en.wikipedia.org/wiki/Electronic_band_structure, visited Mar. 22, 2011) depicts an exemplary (albeit not comprehensive) schematic representation of the relationships between valance bands and conduction bands in materials distinctly classified as metals, semiconductors, and insulators. The band gap is a major factor determining the electrical conductivity of a material. Although metal conductor materials are shown having overlapping valance and conduction bands, there are some conductors that instead have very small band gaps. Materials with somewhat larger band gaps are electrical semiconductors, while materials with very large band gaps are electrical insulators.

Electrons can move between the valence band and the conduction band by means of special processes that give rise to hole-electron generation and hole-electron recombination. Several such processes are related to the absorption and emission of photons which make up light.

Figure 1D:
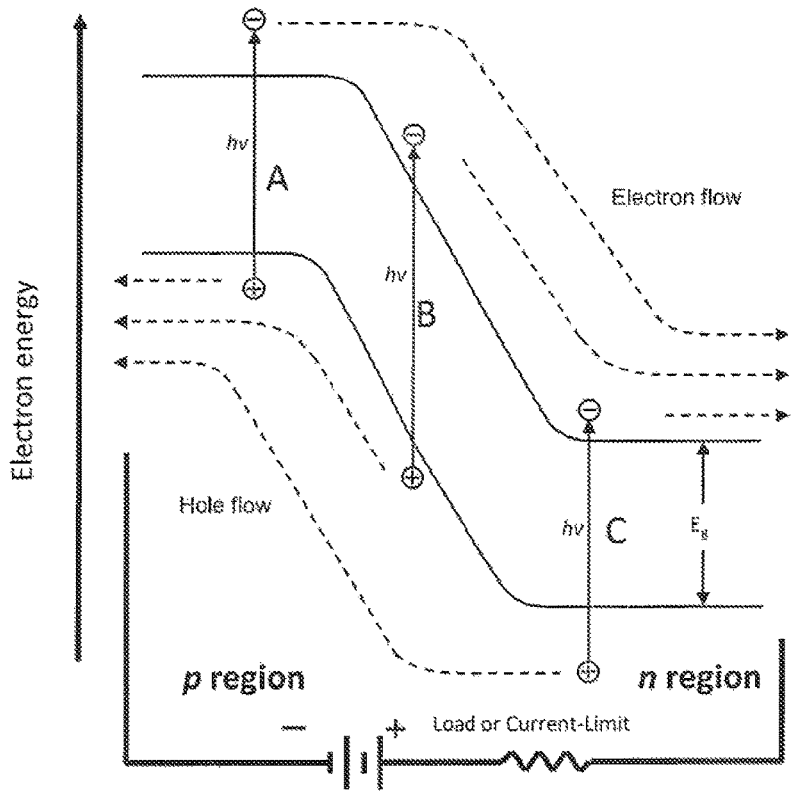
FIG. 1d depicts three exemplary types of electron-hole creation processes resulting from absorbed photons that contribute to current flow in a PN diode (adapted from A. Yariv, Optical Electronics, 4th edition, Saunders College Press, 1991, p. 423).

Light detection in information systems is typically performed by photosite CCD (charge-coupled device) elements, phototransistors, CMOS photodetectors, and photodiodes. By way of example, FIG. 1d (adapted from A. Yariv, Optical Electronics, $4^{th}$ edition, Saunders College Press, 1991, p. 423) depicts three exemplary types of electron-hole creation processes resulting from absorbed photons that contribute to current flow in a PN diode. Emitted photons cause electrons to drop through the band gap while absorbed photons of sufficient energy can excite electrons from the valance band though the band gap to the conduction band.

Photodiodes are often viewed as the simplest and most primitive form of a semiconductor light detector. A photodiode typically comprises a PIN (P-type/Intrinsic/N-type) junction rather than the more abrupt PIN (P-type/N-type) junction of conventional signal and rectifying diodes. However, photoelectric effects and capabilities are hardly restricted to PIN diode structures. In varying degrees, virtually all diodes are capable of photovoltaic properties to some extent.

In particular, LEDs, which are diodes that have been structured and doped for specific types of optimized light emission, can also behave (with at least low-to-medium performance) as photodiodes. Forrest M. Mims has often been credited as calling attention to the fact that that a conventional LED can be used as a photovoltaic light detector as well as a light emitter, see Mims Ill, Forrest M. "Sun Photometer with Light-emitting diodes as spectrally selective detectors" *Applied Optics. Vol.* 31, No. 33, Nov. 20, 1992, incorporated herein by reference. More generally, LEDs, organic LEDs ("OLEDs"), organic field effect transistors, and other related devices exhibit a range of readily measurable photo-responsive electrical properties, such as photodiode-type photocurrents and related photovoltages and accumulations of charge in the junction capacitance of the LED.

In an LED, light is emitted when holes and carriers recombine and the photons emitted have an energy in a small range either side of the energy span of the band gap. Through engineering of the band gap, the wavelength of light emitted by an LED can be controlled. In the aforementioned article, Mims additionally pointed out that as a photodetector LEDs exhibit spectral selectivity with at a light absorption wavelength similar to that of the LED's emission wavelength. Additional details as to the spectral selectivity of the photoelectric response of an LED will be provided below.

Organic semiconductors and their electrical and optoelectrical behavior will now be described. Conjugated organic compounds comprise alternating single and double bonds in the local molecular topology comprising at least some individual atoms (usually carbon, but can be other types of atoms) in the molecule. The resulting electric fields organize the orbitals of those atoms into a hybrid formation comprising a σ bond (which engage electrons in forming the molecular structure among joined molecules) and a π cloud of loosely associated electrons that are in fact delocalized and can move more freely within the molecule. These delocalized π electrons provide a means for charge transport within the molecule and electric current within larger-structures of organic materials (for example, polymers).

Figure 1E:
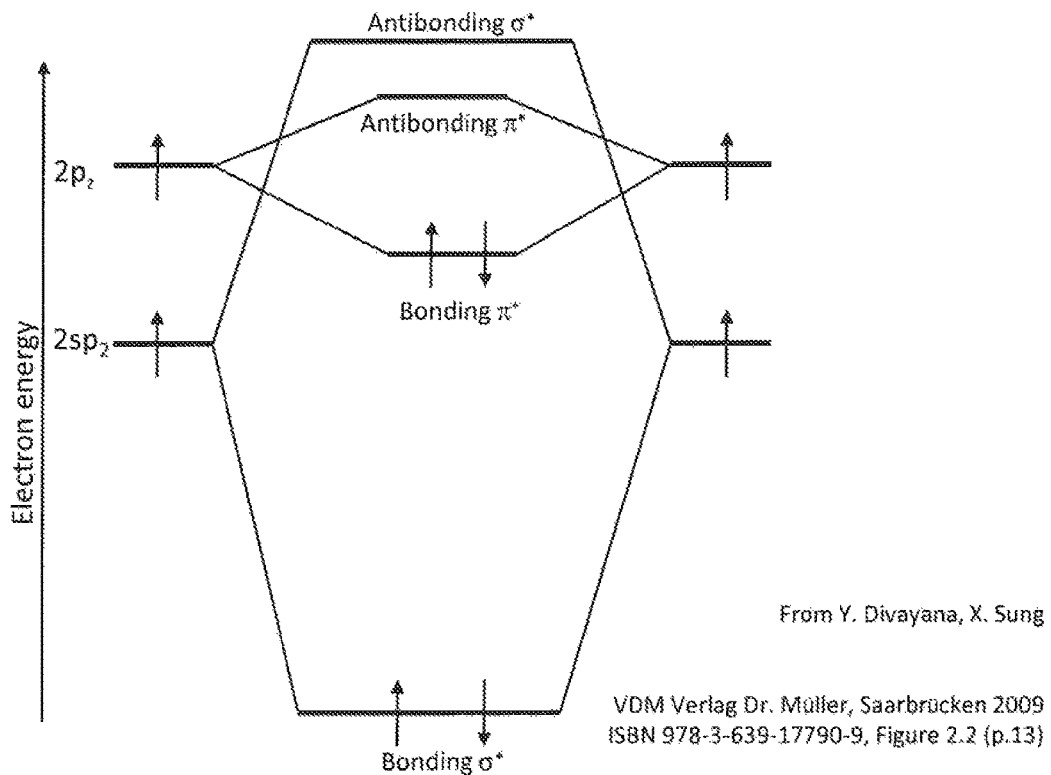
FIG. 1e depicts exemplary electron energy distribution among bonding and antibonding molecular orbitals in conjugated or aromatic organic compounds (adapted from Y. Divayana, X. Sung, Electroluminescence in Organic Light-Emitting Diodes, VDM Verlag Dr. Muller, Saarbrücken, 2009, ISBN 978-3-639-17790-9, FIG. 2.2, p. 13).

Combinations of atomic orbital modalities for the individual atoms in a molecule, together with the molecular topology (created by the σ bonds) and molecular geometry, create molecule-scale orbitals for the delocalized π cloud of electrons and in a sense for the electrons comprising σ bonds. Interactions among the electrons, in particular quantum exclusion processes, create an energy gap between the Highest Occupied Molecular Orbital ("HOMO") and Lowest-Unoccupied Molecular Orbital ("LUMO") for the delocalized π electrons (and similarly does so for the more highly localized σ bond electrons). FIG. 1e (adapted from Y. Divayana, X. Sung, *Electroluminescence in Organic Light-Emitting Diodes*, VDM Verlag Dr. Müller, Saarbrücken, 2009, ISBN 978-3-639-17790-9, FIG. 2.2, p. 13) depicts the electron energy distribution among bonding ($\pi$ and $\sigma$) and antibonding ($\pi^*$ and $\sigma^*$) molecular orbitals in for two electrons in an exemplary conjugated or aromatic organic compound. In such materials, typically the energy gap between the $\pi$ and $\pi^*$ molecular orbitals correspond to the gap between the HOMO and LUMO. The HOMO effectively acts as a valence band in a traditional (inorganic) crystal lattice semiconductor and the LUMO acts as effective equivalent to a conduction band. Accordingly, energy gap between the HOMO and LUMO (usually corresponding to the gap between the $\pi$ and $\pi^*$ molecular orbitals) behaves in a manner similar to the band gap in a crystal lattice semiconductor and thus permits many aromatic organic compounds to serve as electrical semiconductors.

Emitted photons cause electrons to drop through the HOMO/LUMO gap while absorbed photons of sufficient energy can excite electrons from the HOMO to the LUMO. These processes are similar to photon emission and photo absorption processes in a crystal lattice semiconductor and can be used to implement organic LED ("OLED") and organic photodiode effects with aromatic organic compounds. Functional groups and other factors can vary the width of the band gap so that it matches energy transitions associated with selected colors of visual light. Additional details on organic LED ("OLED") processes, materials, operation, fabrication, performance, and applications can be found in, for example:

Z. Li, H. Ming (eds.), *Organic Light-Emitting Materials and Devices*, CRC Taylor & Francis, Boca Raton, 2007, ISBN 1-57444-574-X;

Z. Kafafi (ed.), *Organic Electroluminescence*, CRC Taylor & Francis, Boca Raton, 2005, ISBN 0-8247-5906-0;

Y. Divayana, X. Sung, *Electroluminescence in Organic Light-Emitting Diodes*, VDM Verlag Dr. Müller, Saarbrücken, 2009, ISBN 978-3-639-17790-9, all of which are incorporated by reference herein in their entirety.

Figure 2:
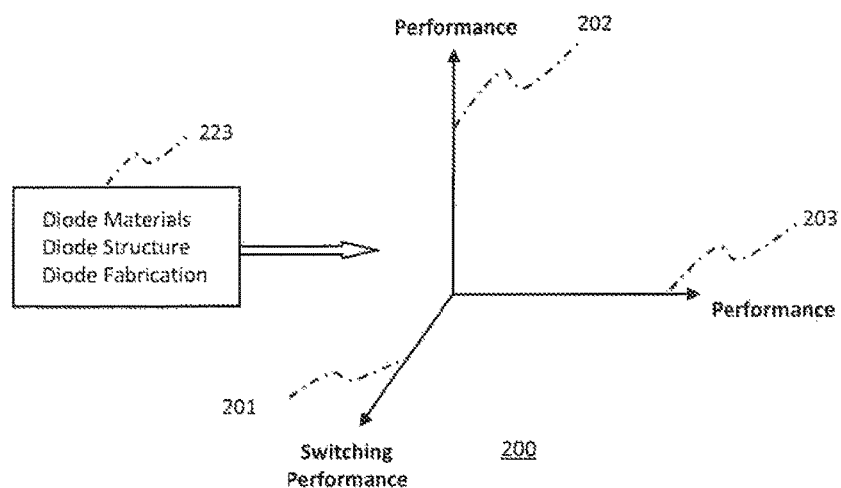
FIG. 2 depicts an optimization space for semiconductor diodes comprising attributes of signal switching performance, light emitting performance, and light detection performance.

FIG. 2 depicts an optimization space 200 for semiconductor (traditional crystal lattice or organic material) diodes comprising attributes of signal switching performance, light emitting performance, and light detection performance. Specific diode materials, diode structure, and diode fabrication approaches 223 can be adjusted to optimize a resultant diode for switching function performance 201 (for example, via use of abrupt junctions), light detection performance 202 (for example via a P-I-N structure comprising a layer of intrinsic semiconducting material between regions of n-type and p-type material, or light detection performance 203.

FIGS. 3a-d depict various exemplary circuits demonstrating various exemplary approaches to detecting light with an LED. These approaches initially introduce the concepts of received light intensity measurement ("detection") and varying light emission intensity of an LED in terms of variations in D.C. ("direct-current") voltages and currents. However, light intensity measurement ("detection") can be accomplished by other means such as LED capacitance effects—for example reverse-biasing the LED to deposit a known charge, removing the reverse bias, and then measuring the time for the charge to dissipate within the LED. Also, varying the light emission intensity of an LED can be accomplished by other means such as pulse-width-modulation—example, a duty-cycle of 50% yields 50% of the "constant-on" brightness, a duty-cycle of 50% yields 50% of the "constant-on" brightness, or the like. These, too, are provided for by various aspects of the invention and will be considered again below as variations of the illustrative approaches described herein.

At the outset, LED1 in FIG. 3a is employed as a photodiode, generating a voltage signal with respect to ground potential responsive to the intensity of the light received at the optically-exposed portion of the LED-structured semiconducting material. In particular, for at least a range of light intensity levels the voltage generated by LED1 increases monotonically with the received light intensity. This voltage can be amplified, for example, by a high input impedance amplifier, preferably with low offset currents. The example of FIG. 2a shows this amplification performed by a simple operational amplifier ("op amp") circuit with fractional negative feedback, the fraction being determined via a voltage divider. The gain provided by this simple op amp arrangement can be readily recognized by one skilled in the art to be:

$1+(R_f/R_g).$

In many cases best performance is obtained if the amplifier input is a JFET, MOSTFET, or other FET transistor.

In the circuit shown in FIG. 3a, the op amp produces an isolated and amplified output voltage that increases, at least for a range, monotonically with increasing light received at the light detection LED 1. Further in this illustrative exemplary circuit, the output voltage of the op amp is directed to LED 100 via current-limiting resistor R100. The result is that the brightness of light emitted by LED 100 varies with the level of light received by LED 1.

For a simple lab demonstration of this rather remarkable fact, one can choose a TL08x series (TL082, TL084, etc.) or equivalent op amp powered by +12 and −12 volt split power supply, R100 of about 1 KΩ, and $R_f/R_g$ in a ratio ranging from 1 to 20 depending on the type of LED chosen. LED 100 will be dark when LED 1 is engulfed in darkness and will be brightly lit when LED 1 is exposed to natural levels of ambient room light. For best measurement studies, LED 1 could comprise a "water-clear" plastic housing (rather than color-tinted). It should also be noted that the LED 1 connection to the amplifier input is of relatively high impedance and as such can readily pick up AC fields, radio signals, etc. and is best realized using as physically small electrical surface area and connector length as possible. In a robust system, electromagnetic shielding is advantageous.

The demonstration circuit of FIG. 3a can be improved, modified, and adapted in various ways (for example, by adding voltage and/or current offsets, JFET preamplifiers, etc.), but as shown is sufficient to demonstrate that a wide range of conventional LEDs can serve as pixel sensors for an ambient-room light sensor array as can be used in a camera or other room-light imaging system. Additionally, LED 100 illustrates the role an LED can play as a pixel emitter of light.

FIG. 3b provides a demonstration circuit for illustrating the photocurrent of the LED. For at least a range of light intensity levels the photocurrent generated by LED 1 increases monotonically with the received light intensity. In this exemplary circuit the photocurrent is directed to a natively high-impedance op amp (for example, a FET input op amp such as the relatively well-known LF 351) set up as an inverting current-to-voltage converter. The magnitude of the transresistance (i.e., the current-to-voltage "gain") of this inverting current-to-voltage converter is set by the value of the feedback resistor Rf. The resultant circuit operates in a similar fashion to that of FIG. 3a in that the output voltage of the op amp increases, at least for a range, monotonically with increasing light received at the light detection LED. The inverting current-to-voltage converter inverts the sign of the voltage, and such inversion in sign can be corrected by a later amplification stage, used directly, or is preferred. In other situations it can be advantageous to not have the sign inversion, in which case the LED orientation in the circuit can be reversed, as shown in FIG. 3c.

FIG. 3d provides an illustrative demonstration arrangement in which an LED can be for a very short duration of time reverse biased and then in a subsequent interval of time the resultant accumulations of charge in the junction capacitance of the LED are discharged. The decrease in charge during discharge through the resistor R results in a voltage that can be measured with respect to a predetermined voltage threshold, for example as can be provided by a (non-hysteretic) comparator or (hysteretic) Schmitt-trigger. The resulting variation in discharge time varies monotonically with the light received by the LED. The illustrative demonstration arrangement provided in FIG. 2d is further shown in the context of connects to the bidirectional I/O pin circuit for a conventional microprocessor. This permits the underlying principal to be readily demonstrated through a simple software program operating on such a microprocessor. Additionally, as will be described below, the very same circuit arrangement can be used to variably control the emitted light brightness of the LED by modulating the temporal pulse-width of a binary signal at one or both of the microprocessor pins.

The one or more aspects of the present invention, as well as the system described in U.S. Patent Application Publication No. 2009/0290034 provide for relations between the spectral detection band and the spectral emission bands of each of a plurality of colors and types of colored-light LEDs, OLEDS, and related light-emitting devices to be used to implement color-selective measurement capabilities, and for these in turn to be implement a color light-field sensor from, for example, a color LED or OLED array display. Such an arrangement was described in U.S. Patent Application Publication No. 2009/0290034. That U.S. Patent Application Publication No. 2009/0290034 additionally teaches how such a light-field sensor can be used together with signal processing software to create lensless-imaging camera technology, and how the such technology can be used to create an integrated camera/display device which can be used, for example, to deliver precise eye-contact in video conferencing applications.

Color LED array displays are currently employed in "LED TV" products and road-side and arena color-image LED advertising signs. Color OLED array displays have begun to appear in cellphones (such as those from Samsung and others). Color OLED array displays are of particular interest because:

- they can be fabricated (along with associated electrical wiring conductors) via printed electronics on a wide variety of surfaces such as glass, Mylar, plastics, paper, etc.;
- Leveraging some such surface materials, they can be readily bent, printed on curved surfaces, etc.;
- They can be transparent (and be interconnected with transparent conductors);
- Leveraging such transparency, they can be:
  Stacked vertically,
  Used as an overlay element atop an LCD or other display,
  Used as an underlay element between an LCD and its associated backlight.

In particular, such color LED or OLED arrays typically comprise 'color LEDs' or 'color cells.' Each color LED or color cell internally comprises a red LED, green LED, and blue LED element. In some embodiments, the constituent red, green, and blue LED elements are closely spaced in a plane orthogonal to the principle designed direction of light emission. In other embodiments, for example those employing transparent organic LEDs (OLEDs), two or three of the constituent red, green, and blue LED elements are stacked in a stack oriented in the same principle designed direction of light emission.

The reason for the use of red, green, and blue in a color LED or color cell is due to the color perceptual mechanism of the human eye. As to this, FIG. 4a depicts an exemplary representation of human eye sensitivity to the spectrum of wavelengths of visible light. The human eye comprises "cone" and "rod" constituent densely-packed spatially-distributed structures, wherein the rods detect incoming light brightness (luminance) while three types of cones discern three primary colors red, green, and blue. Note in particular the spectral overlaps among the sensitivity curves for colors red, green, and blue, as well as the positions of their relative maxima and minima with respect to one another.

In contrast to this arrangement within the perceptual mechanism of the human eye, the spectral bandwidth for the light emissions of a typical traditional LED is typically 50 nm of wavelength.

Positioning three approximately 50 nm pass-bands in the portions of the visible spectrum near peaks of the cone responses yet away from areas of significant spectral overlap would result in a spectral placement such as that depicted in the example of FIG. 4b.

For use as a monitor, one approach to a good performance would be the arrangement depicted in FIG. 4c. FIG. 4c depicts an exemplary arrangement of red, green, and blue LED emission spectra of FIG. 4b as driven by measurements of energy in each of the red, green, and blue pass-bands of FIG. 4a. Here an "ideal sensor" mimics the cone responses of the human eye and provides resultant red, green, and blue measurements. These measurements in turn would drive the amplitudes of the narrowband LED emissions from FIG. 4b, which in turn stimulate the three human eye color cone responses in areas of relatively low sensitivity overlap.

Attention is now directed to using color LEDs, color OLEDs, and related devices as color sensor elements for human-perceived images.

For use as a sensor, clearly a spectral placement of three 50 nm pass-band s such as that depicted in the example of FIG. 4b comprises gaps in the spectral coverage. If sensing elements indeed provided such 50 nm pass-bands positioned as in the example of FIG. 4b, light for example with a wavelength of 490 nm would be hardly, if at all, sensed by the blue and green sensing elements. However, as light sensors, fortuitously the spectral response of an inorganic LED, OLED, or related device is not one of a "band-pass" filter with respect to wavelength (i.e., implementing the aforedescribed sensitivity-response pass-bands) but instead one of a "high-pass" filter with respect to light frequency (and correspondingly, a "low-pass" filter with respect to light wavelength). The various aspects of the present invention (and the system described in the U.S. Patent Application Publication No. 2009/0290034) leverage this in a two-step process:

First, use the "high-pass" filter spectral response respect to frequency for an inorganic LED, OLED, or related device to "fill-in" the gaps, and Second, use subtractive operations to transform partially-overlapping "high-pass" filter spectral responses from an inorganic LED, OLED, or related device of one frequency.

Referring to FIG. 1 e, the photon energy must be at least as large as the bandgap energy $E_g$ in order for the photocurrent and related effects (photovoltage, etc.) to occur. This means the light frequency v must satisfy:

$$hv > E_g$$

or $$v > E_g/h,$$

meaning that the wavelength must be shorter than a threshold value that is proportional (scaled by light propagation speed) to $$h/E_g.$$

Figure 5A:
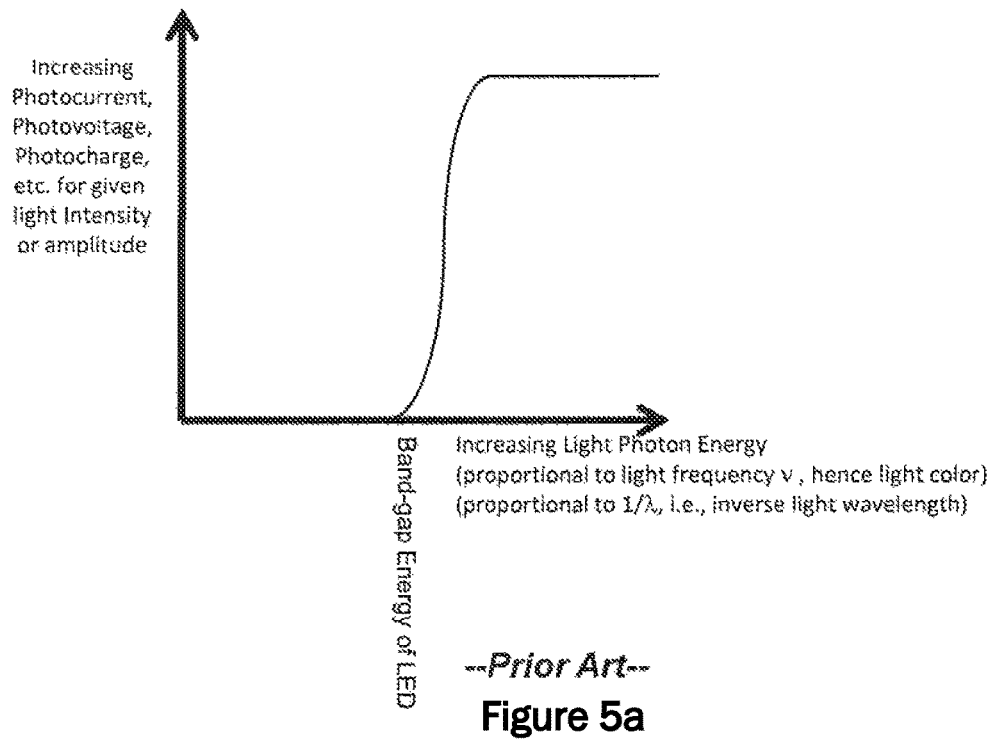
FIGS. 5a and 5b depict wavelength/energy thresholding effects and light amplitude saturation effects on photocurrent, photovoltage, and/or photocharge of an LED and signals produced from these by electronic interface circuitry.
Figure 5B:
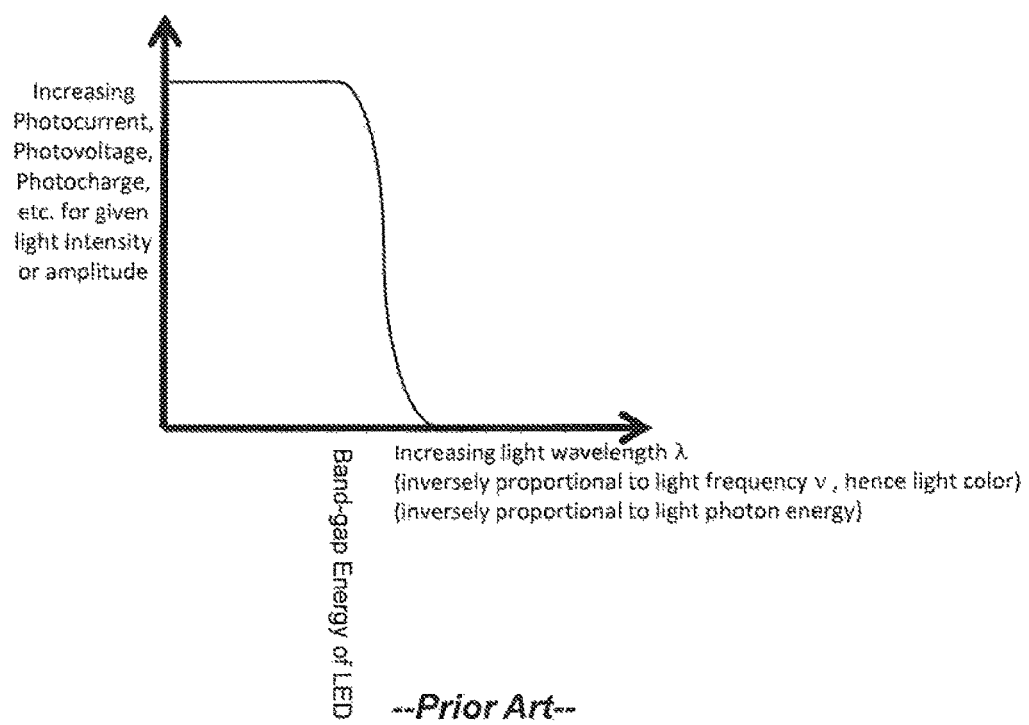

Light with a wavelength shorter than this maximum threshold wavelength will also cause the photocurrent and related effects (photovoltage, etc.) to occur. This photon-energy-dependent (and hence wavelength-dependent) thresholding effect is schematically suggested in FIGS. 5a and 5b. In FIG. 5a, the horizontal scale left-to-right represents increasing photon energy and hence decreasing photon wavelength. In FIG. 5b the horizontal scale left-to-right represents increasing photon wavelength and hence decreasing photon energy. FIGS. 5a and 5b also depict light amplitude saturation effects on photocurrent, photovoltage, and/or photocharge of an inorganic LED, OLED, or related device and signals produced from these by electronic interface circuitry. The amplitude saturation effects can be influenced by electronic interface circuitry, and electronic interface circuitry can also impose saturation effects on output signals responsive to the photocurrent, photovoltage, and/or photocharge of the connected inorganic LED, OLED, or related device.

Returning attention to the aformentioned thresholding effect, a key resultant wavelength-differentiation manifestation is that:

Red light with a wavelength short enough to cause a photocurrent, photovoltage, etc. in a particular red LED:
will not cause a photocurrent, photovoltage, etc. in a green inorganic LED, OLED, or related device,
will not cause a photocurrent, photovoltage, etc. in a blue inorganic LED, OLED, or related device.

Green light with a wavelength short enough to cause a photocurrent, photovoltage, etc. in a particular green inorganic LED, OLED, or related device:
will cause a photocurrent, photovoltage, etc. in a red inorganic LED, OLED, or related device,
will not cause a photocurrent, photovoltage, etc. in a blue inorganic LED, OLED, or related device.

Blue light with a wavelength short enough to cause a photocurrent, photovoltage, etc. in a particular green LED:
will cause a photocurrent, photovoltage, etc. in a red inorganic LED, OLED, or related device,
will cause a photocurrent, photovoltage, etc. in a green inorganic LED, OLED, or related device.

FIG. 6a depicts the resulting cascading 'turn-on' effect for a given red, green, and blue inorganic LED, OLED, or related device as light frequency, and hence light photon energy, increases from left-to-right (corresponding to inversely proportional light wavelength decreasing from left-to-right).

FIG. 6b depicts the resulting cascading 'turn-on' effect for a given red, green, and blue inorganic LED, OLED, or related device as light wavelength increases from left-to-right (corresponding to inversely proportional light frequency and light photon energy decreasing from left-to-right).

From the above, the red photocurrent, photovoltage, etc. signal will be responsive to red light up to a certain light frequency. Thus a red inorganic LED, OLED, or related device of proper selected frequency can be used as the red light sensor for the arrangement of FIG. 4c.

The green photocurrent, photovoltage, etc. signal will be responsive to not only green light but to red light as well. Thus, in order to obtain a green output signal with a response adequately like that depicted in FIG. 4c, the red response must somehow be removed. One way to accomplish this is with a light-frequency selective filter. Another way would be to somehow "subtract out" the signal produced by the (closely located or stacked) red inorganic LED, OLED, or related device.

Similarly the blue photocurrent, photovoltage, etc. signal will be responsive to not only blue light but to red light and green light as well. Thus, in order to obtain a blue output signal with a response adequately like that depicted in FIG. 4c, the red and green response must somehow be removed. One way to accomplish this is with a light-frequency selective filter. Another way would be to somehow "subtract out" the signal produced by one or more of the associate (closely located or stacked) red and green inorganic LEDs, OLEDs, or related devices. Additionally, in an embodiment, an ultraviolet filter can be used to block shorter wavelength ultraviolet light from the red, green, and blue inorganic LEDs, OLEDs, or related devices.

Figure 7:
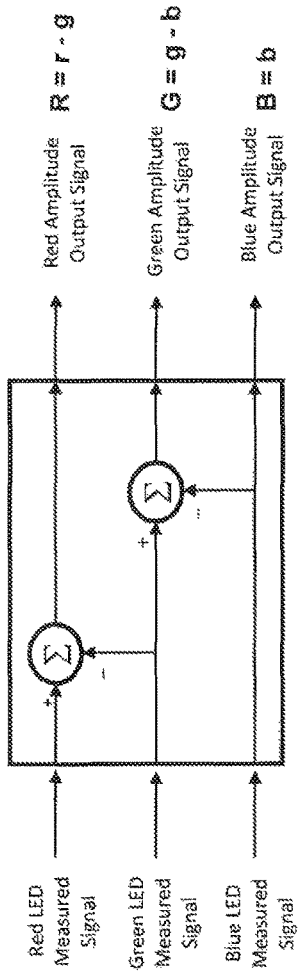
FIG. 7 depict an exemplary arrangement for implementing a linear signal subtraction arrangement.
Figure 8:
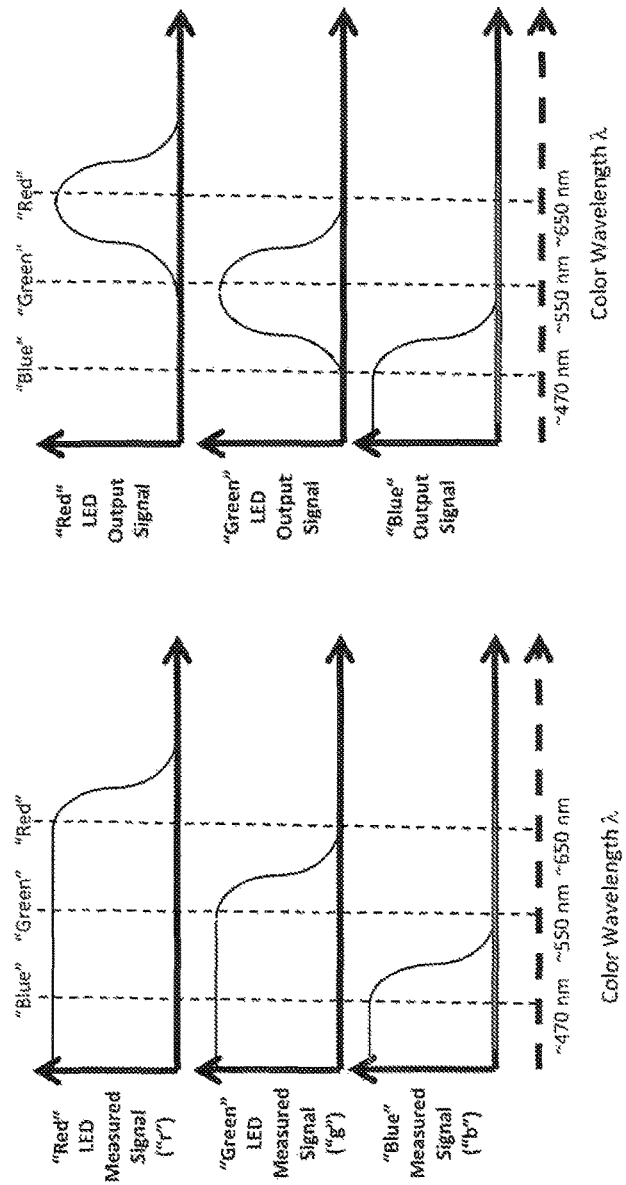
FIG. 8 depicts exemplary responses resulting from the exemplary linear signal subtraction arrangement depicted in FIG. 7.

FIG. 7 depicts an exemplary arrangement for implementing such a signal subtraction arrangement. If implemented literally, this arrangement would require the electro-optical responses of the inorganic LEDs, OLEDs, or related devices to be linear and to be matched for ranges of overlapping wavelength. In general some amplitude adjustment can be required in many circumstances to normalize the electro-optical responses of the inorganic LEDs, OLEDs, or related devices so they match for ranges of overlapping wavelength. In general most amplitude responses (prior to amplitude saturation) are linear, but in some circumstances a nonlinear correction can be required. FIG. 8 schematically depicts exemplary responses resulting from the exemplary linear signal subtraction arrangement depicted in FIG. 7. Again, in an embodiment, an ultraviolet filter can be used to block shorter wavelength ultraviolet light from the inorganic LEDs, OLEDs, or related devices.

Amplitude Response Normalization

Figure 9:
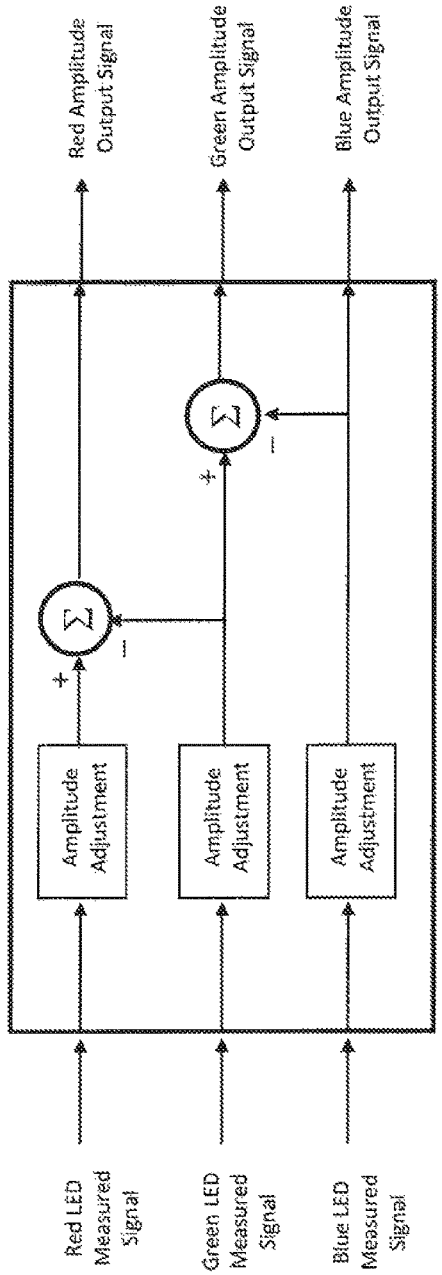
FIG. 9 depicts an adaptation of FIG. 7 where amplitudes are adjusted prior to summing.

As mentioned above, in general, some amplitude adjustment can be required in many circumstances to normalize the electro-optical responses of the inorganic LEDs, OLEDs, or related devices so that they match for ranges of overlapping wavelength. FIG. 9 depicts an adaptation of FIG. 7 where amplitudes are adjusted prior to subtractive summing.

Figure 10:
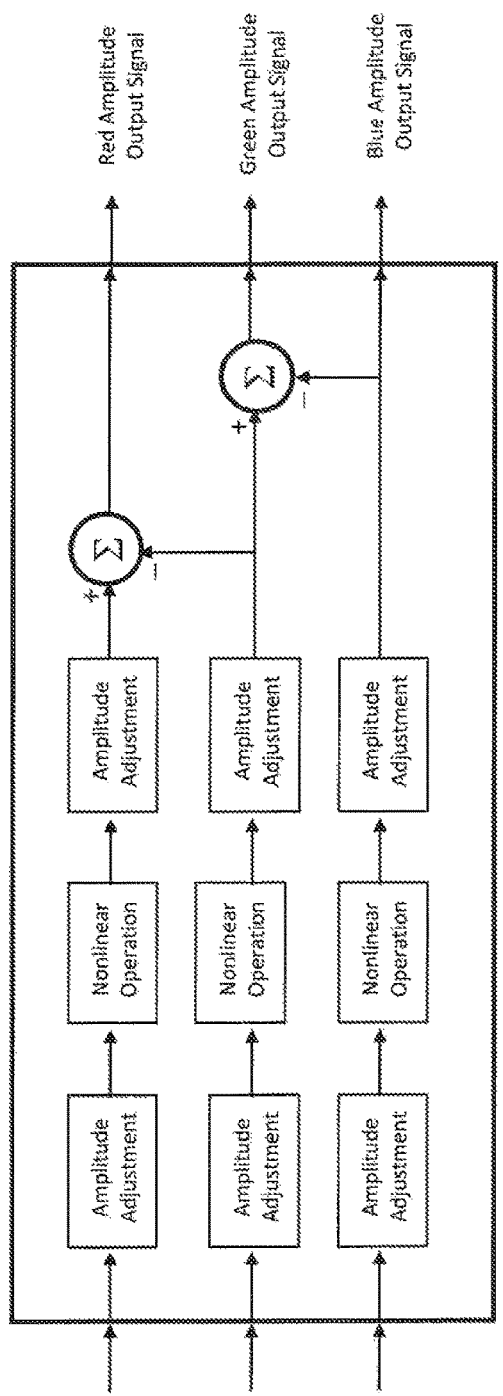
FIG. 10 depicts an adaptation of FIG. 7 wherein an exemplary nonlinear operation is made prior to summing.

Use of Nonlinear Operations so as to Obtain Pre-Summing Linearization if Required Also as mentioned, most amplitude responses (prior to amplitude saturation) are linear, but in some circumstances a nonlinear correction can be required to obtain a linear response prior to subtractive summing. FIG. 10 depicts an adaptation of FIG. 7 wherein an exemplary nonlinear operation is made prior to the subtractive summing. In FIG. 10, amplitude adjustments are shown as being made before and after a nonlinear operation prior to summing, but these can be omitted and/or absorbed into the nonlinear operation.

Other Cases of Nonlinear Operations

Figures 11, 12:
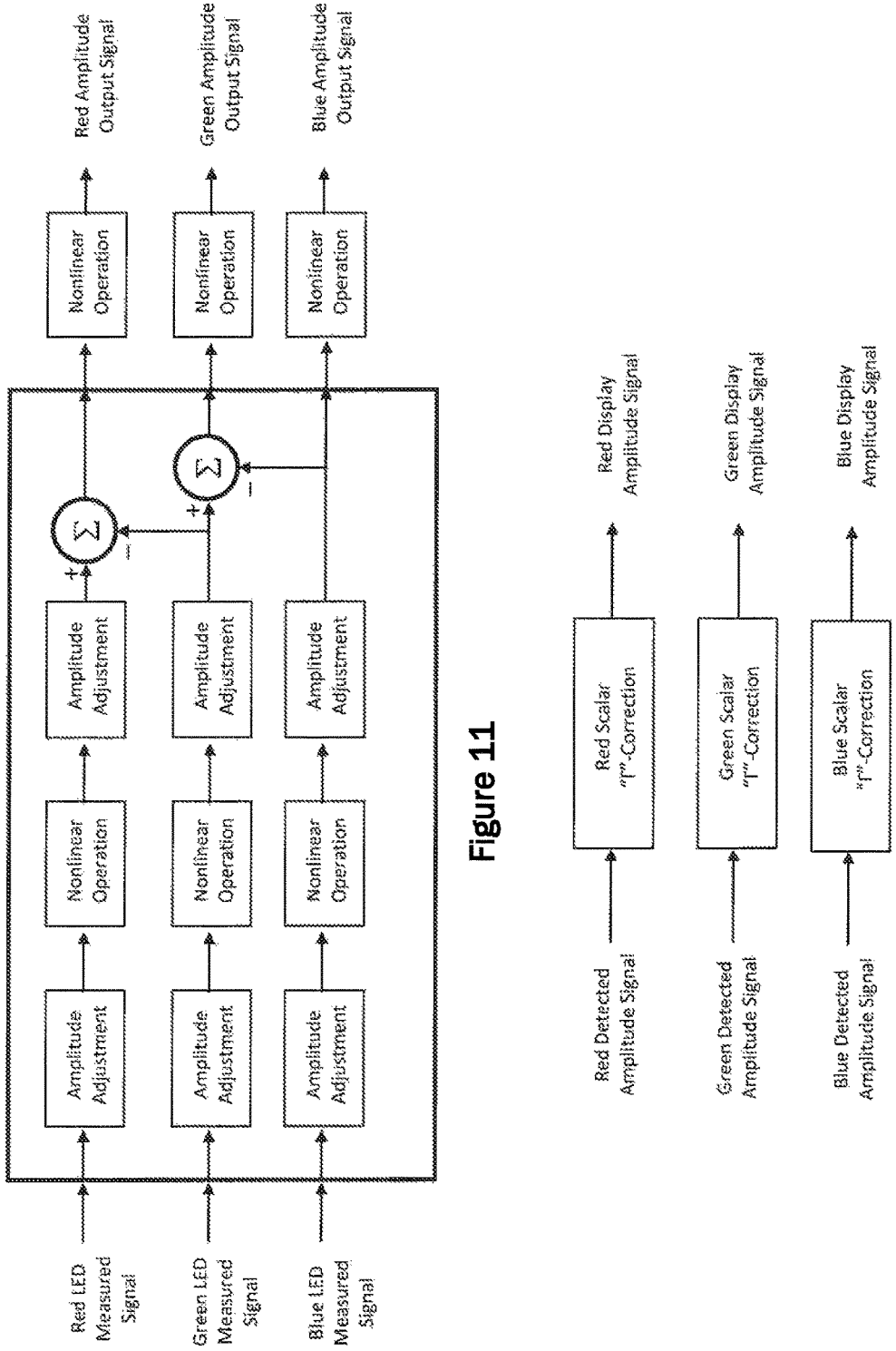
FIG. 11 depicts an adaptation of FIG. 7 wherein exemplary nonlinear operations are made after summing as well as prior to summing.
FIG. 12 depicts separated (scalar) "gamma correction" operation arrangements for application to red, green, and blue measurement data streams provided by detection signal arrangements and/or to display systems.

FIG. 11 depicts an adaptation of FIG. 7 wherein exemplary nonlinear operations are made after summing as well as prior to summing. In FIG. 11, amplitude adjustments are shown as being made before and after the pre-summing nonlinear operations, but these can be omitted and/or absorbed into the nonlinear operation. Similarly, amplitude adjustments can be introduced before and/or after the post-summing nonlinear operations. In an embodiment, passive or active local interfacing electronics can provide nonlinear operations on signals from other inorganic LEDs, OLEDs, or related devices can be proximate to or integrated in with a cluster of associated inorganic LEDs, OLEDs, or related devices.

The various aspects of the invention provide for one or more of the above signal processing operations to be used in conjunction with wavelength-selective optical filters on one or more of the LEDs.

The various aspects of the invention provide for one or more of the above signal processing operations to be used in conjunction without wavelength-selective optical filters on one or more of the inorganic LEDs, OLEDs, or related devices.

The various aspects of the invention provide for pre-summing nonlinear operations for two or more light colors to be combined in a vector nonlinear operation.

The various aspects of the invention provide for post-summing nonlinear operations for two or more light colors to be combined in a vector nonlinear operation.

Nonlinear Operations for Gamma Correction

As disclosed in the aforesaid pending U.S. Patent Application Publication No. 2009/0290034, the detection capabilities of inorganic LEDs, OLEDs, or related devices can have an undesirable amplitude response with respect to received light amplitude or intensity. In this case, the invention provides for the application of traditional or more advanced forms of nonlinear "gamma correction" to the detected signals provided by the array. The gamma correction need not be limited to the traditional family of binomial power curves but instead be any appropriate nonlinearity that proves useful. The "gamma correction" is applied to measurement data streams provided by the detection multiplexing arrangement (rather than separately implemented for each inorganic LED, OLED, or related device). In some embodiments the "gamma correction" is made advantageously made separately for each color detection signal as suggested by FIG. 12. Here, separated (scalar) "gamma correction" operation arrangements are applied to red, green, and blue measurement data streams provided by detection signal arrangements and/or to display systems.

Figure 13:
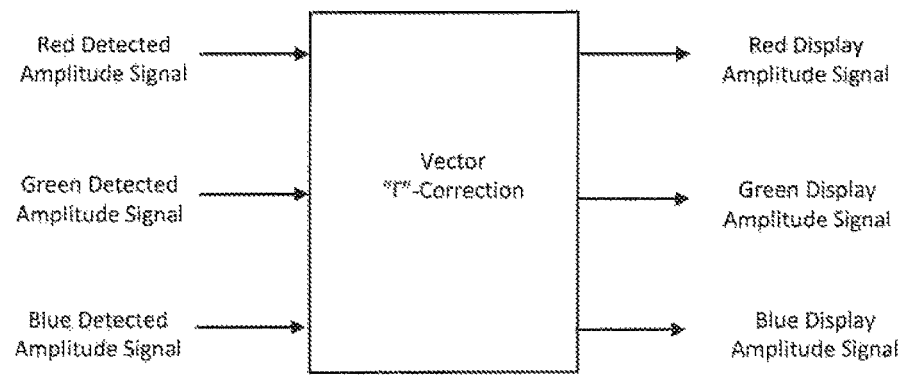
FIG. 13 depicts a combined (vector) "gamma correction" operation arrangements for application to red, green, and blue measurement data streams provided by detection signal arrangements and/or to display systems.

In other embodiments the "gamma correction" is made advantageously on the vector of color detection signals as suggested by FIG. 13, allowing for cross-coupled corrections. FIG. 13 depicts a combined (vector) "gamma correction" operation arrangement for application to the red, green, and blue measurement data streams provided by detection signal arrangements and/or to display systems. Such cross-coupled corrections can be useful in color handling issues in regions of the spectrum where there is considerable overlap in the human eyes cone response curves. These are also discussed in the aforementioned U.S. Patent Application Publication No. 2009/0290034.

In an embodiment, gamma correction features such as those depicted in FIG. 12 and/or FIG. 13 can be used in conjunction with and/or integrated into arrangements such as those depicted in one or more of FIGS. 7-11.

Various aspects of the invention provide for the gamma correction operations described above to be absorbed and/or combined with the nonlinear operations depicted in FIG. 11.

Improved Matching of Color Sensing to the Color Response of the Human Eye for High-Performance Color Imaging Leveraging fabrication techniques for arrays of color inorganic LEDs, OLEDs, and related devices, it can be relatively inexpensive in mass production to include additional color inorganic LEDs, OLEDs, or related devices so as to provide additional wavelength sensing bands. In some cases additional colors can be added via minor variations to red, green, and blue inorganic LED, OLED, or related device structures. In some cases additional colors can be added via minor variations to dopings or inks used in fabricating red, green, and blue inorganic LED, OLED, or related device elements. In some cases, both techniques can be used. In some cases, yet other techniques can be used together with one or both of the above techniques. In some cases, alternative techniques can be used. Particularly in the case of OLED arrays realized by printed electronics, addition of additional color inorganic LEDs, OLEDs, or related devices so as to provide additional wavelength sensing bands can be relatively trivial and inexpensive process additions. In an embodiment, passive or active local interfacing electronics to combine signals from additional inorganic LEDs, OLEDs, or related devices providing additional wavelength sensing bands with signals from other inorganic LEDs, OLEDs, or related devices can be proximate to or integrated in with a cluster of associated inorganic LEDs, OLEDs, or related devices. In an embodiment, an ultraviolet filter can be used to block shorter wavelength ultraviolet light from the inorganic LEDs, OLEDs, or related devices.

Figure 14:
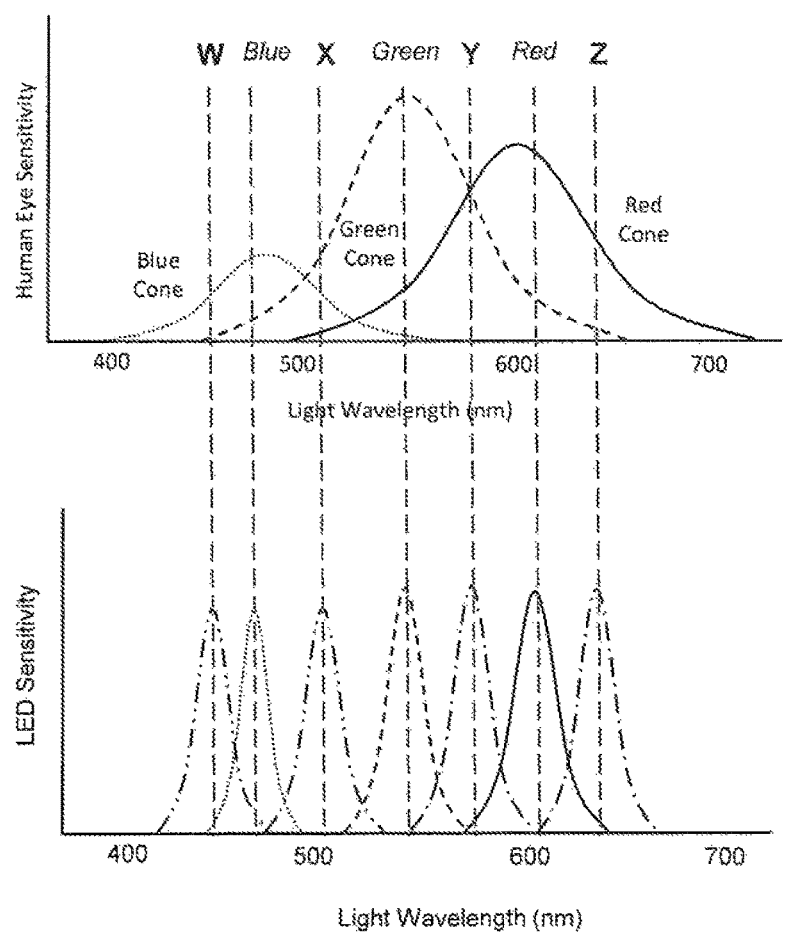
FIG. 14 depicts an exemplary color sensing arrangement employing additional color inorganic LEDs, OLEDs, or related devices so as to provide additional wavelength sensing bands and exemplary emission spectral positions of those with respect to the spectral positions of the color response curves for the red, green, and blue cones of the human eye.
Figure 15:
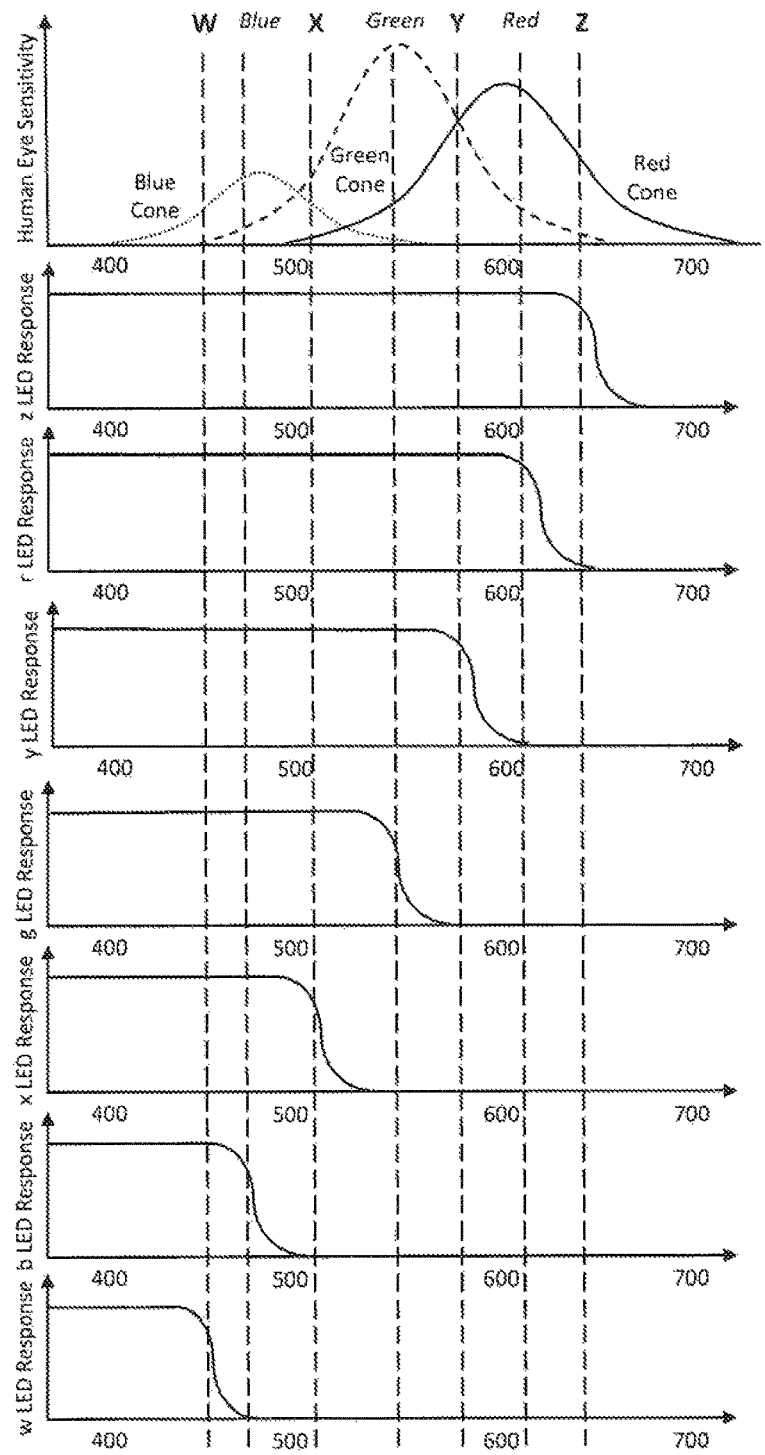
FIG. 15 the photoelectric response curves corresponding to the FIG. 14 arrangement of color inorganic LEDs, OLEDs, or related devices and the spectral positions of those with respect to the spectral positions of the color response curves for the red, green, and blue cones of the human eye.

As an example, FIG. 14 depicts an exemplary seven-color sensing arrangement employing additional color inorganic LEDs, OLEDs, or related devices so as to provide additional wavelength sensing bands. In FIG. 14 the exemplary spectral positions of the inorganic LED, OLED, or related device light emission are depicted with respect to the spectral positions of the color response curves for the red, green, and blue cones of the human eye. FIG. 15 the photoelectric response curves corresponding to the FIG. 14 arrangement of color inorganic LEDs, OLEDs, or related devices and the spectral positions of those with respect to the spectral positions of the color response curves for the red, green, and blue cones of the human eye.

Various embodiments of the invention also provide for other variations in numbers and spectral positions of additional color channels. For example, should the amplitude response of inorganic LEDs, OLEDs, or related devices have (optical-wavelength) transition regions (in which there is no/little amplitude response to maximum/near-maximum amplitude response) be narrow with respect to the (optical wavelength) bandwidth of optical sensitivity of an associated color cone of human vision, the incorporation of one or more additional color sensing inorganic LEDs, OLEDs, or related devices at a different spectral position can provide more sensitivity to amplitudes of measured light and thus better approximate the color sensitivity of the human eye in the light-field sensor.

Figure 16:
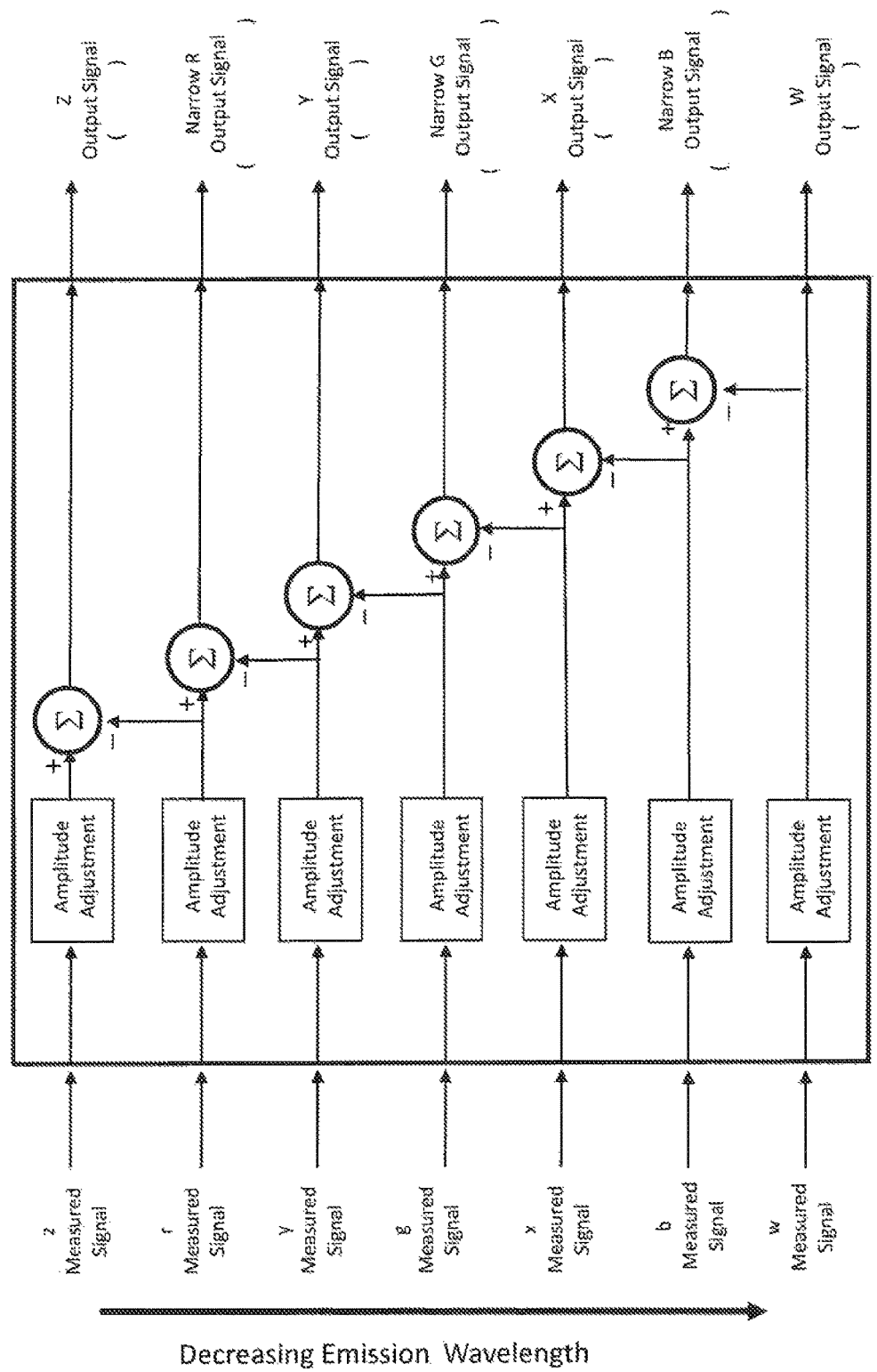
FIG. 16 depicts an exemplary color band transformation arrangement that can be used, for example, with the exemplary color sensing arrangement of FIG. 15.

The same techniques as applied in FIGS. 7-12 to the measured signals produced by a three color sensing system can be extended and applied to the exemplary seven color sensing system (or other variations in numbers and spectral positions of additional color channels). For example, FIG. 16 depicts an exemplary color band transformation arrangement, analogous to that depicted in FIG. 7 for three color sensing system, which can be used with the exemplary color sensing arrangement of FIG. 15. However, other color band transformation arrangements of interest and advantage are possible, for example arrangements such as that described below.

Figure 17A:
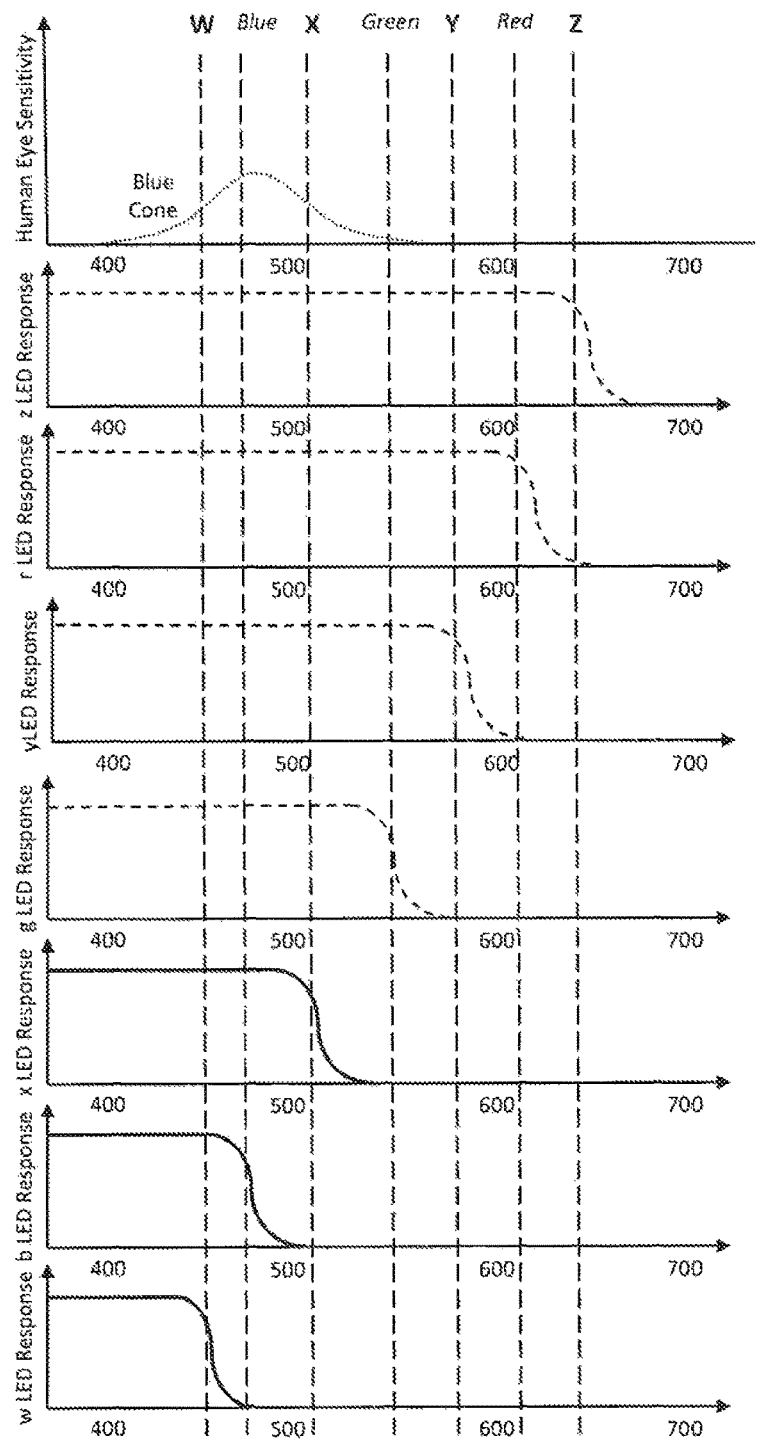
FIG. 17a depicts the photoelectric response curves of FIG. 15 wherein the w, b, and x sensors capture spectral amplitude information within the pass-band associated with the spectral sensitivity of the blue cone of human vision.
Figure 17B:
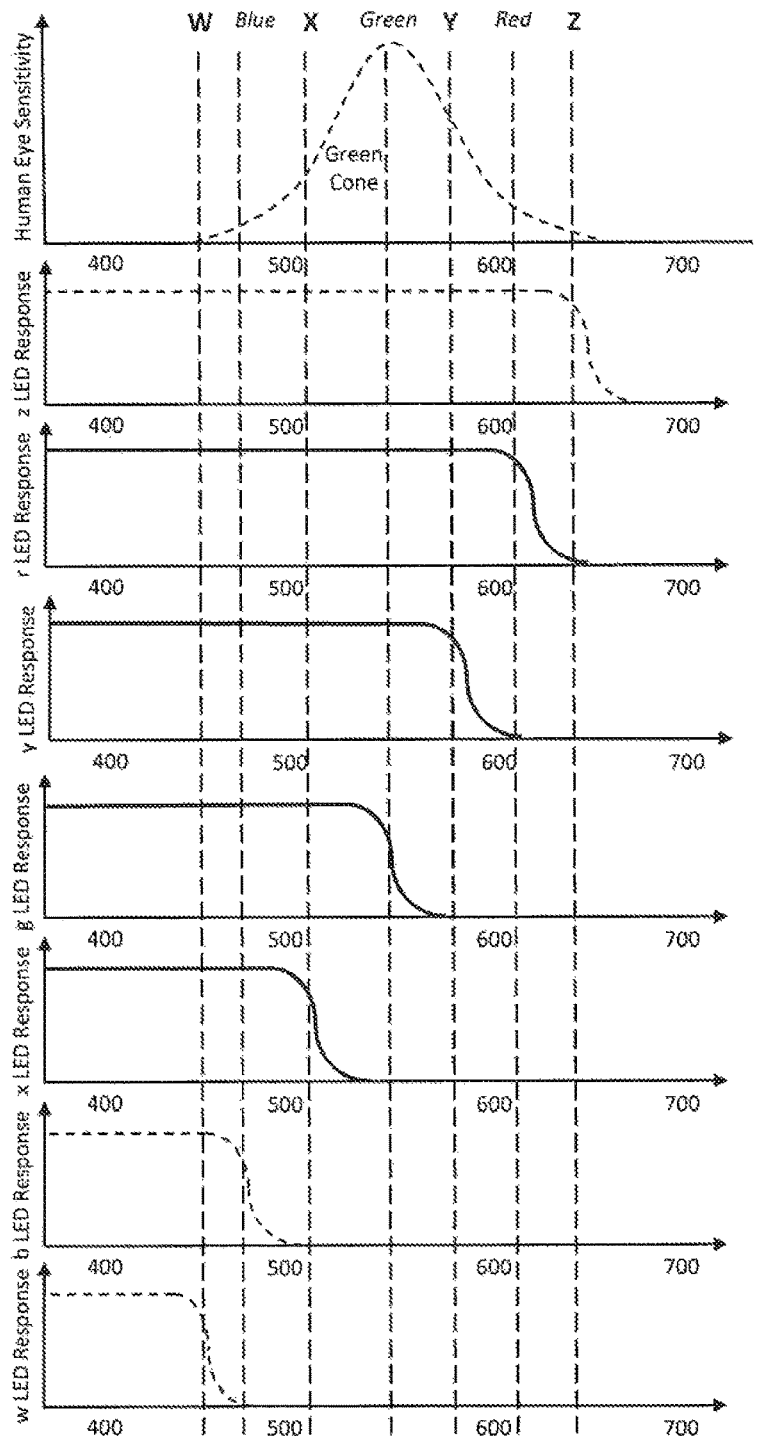
FIG. 17b depicts the photoelectric response curves of FIG. 15 wherein the x, g, y, and r sensors capture spectral amplitude information within the pass-band associated with the spectral sensitivity of the green cone of human vision.
Figure 17C:
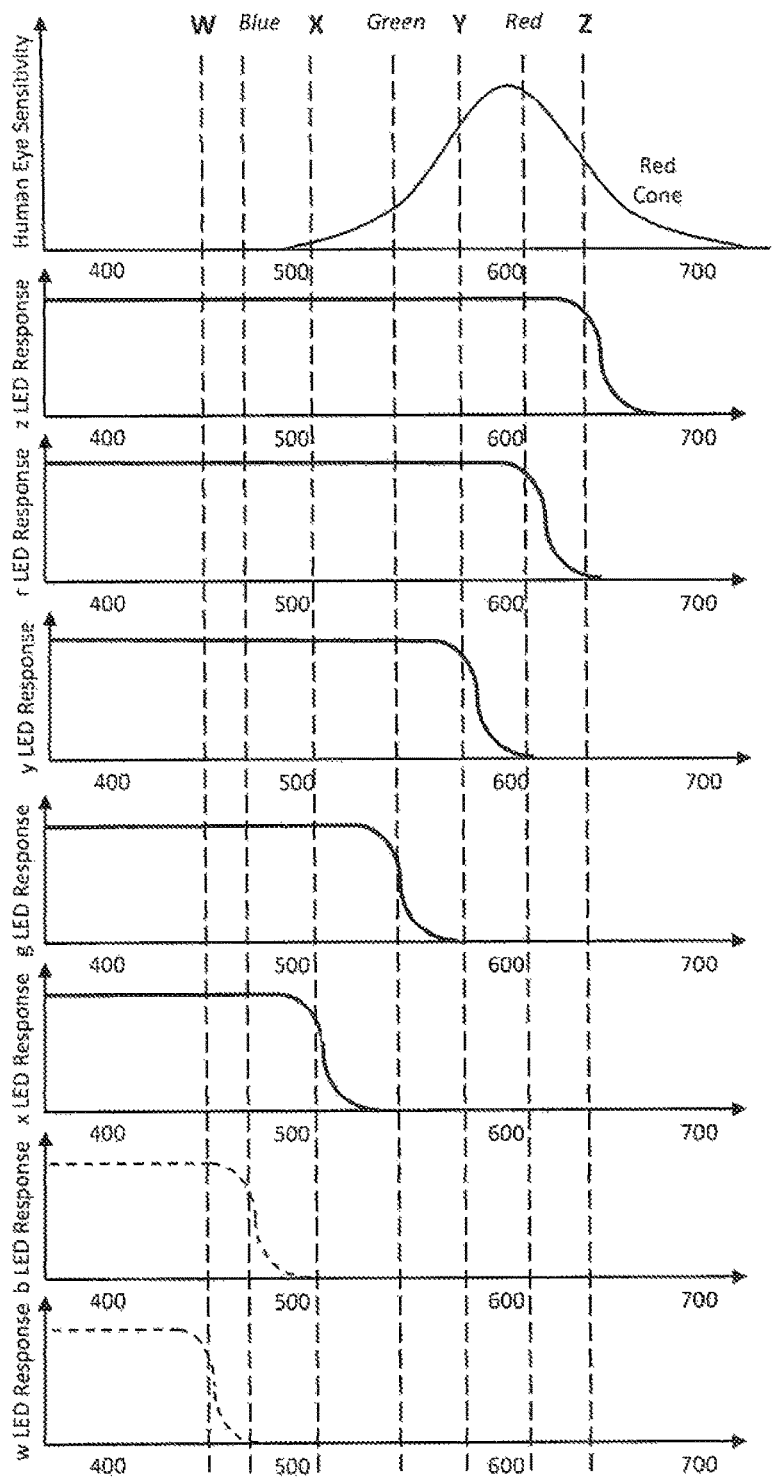
FIG. 17c depicts the photoelectric response curves of FIG. 15 wherein the x, g, y, r, and z sensors capture spectral amplitude information within the pass-band associated with the spectral sensitivity of the red cone of human vision.

Referring to FIG. 4a, it can be seen that the response curves for the red, green, and blue cones of human vision each have significant spectral width and spectral overlap. Referring to FIG. 15, it can be seen that the spectral width of the response curves for the red, green, and blue cones overlap with distinct subsets of the seven sensing colors w, b, x, g, y, r, z. In particular:

FIG. 17a depicts the photoelectric response curves of FIG. 15 wherein the w, b, and x sensors capture spectral amplitude information within the pass-band associated with the spectral sensitivity of the blue cone of human vision;

FIG. 17b depicts the photoelectric response curves of FIG. 15 wherein the x, g, y, and r sensors capture spectral amplitude information within the pass-band associated with the spectral sensitivity of the green cone of human vision;

FIG. 17c depicts the photoelectric response curves of FIG. 15 wherein the x, g, y, r, and z sensors capture spectral amplitude information within the pass-band associated with the spectral sensitivity of the red cone of human vision.

This suggests that:

A function of the w, b, and x sensor signals can be used to closely approximate the spectral sensitivity of the blue cone of human vision;

A function of the x, g, y, and r sensor signals can be used to closely approximate the spectral sensitivity of the green cone of human vision;

A function of the x, g, y, r, and z sensor signals can be used to closely approximate the spectral sensitivity of the red cone of human vision.

The resulting close approximations of the spectral sensitivities of the red, green, and blue cones of human vision can be used to implement a higher-precision color sensing system. In an exemplary embodiment, the signals closely approximating the spectral sensitivities of the red, green, and blue cones of human vision can be used to drive red, green, and blue light emissions for color inorganic LEDs, OLEDs, or related devices in a three-color display employing a spectral placement such as that described in conjunction with FIG. 4c (as shown in the vertically-middle plot with vertical axis labeled "Possible LED Emission Spectrum").

Figure 18:
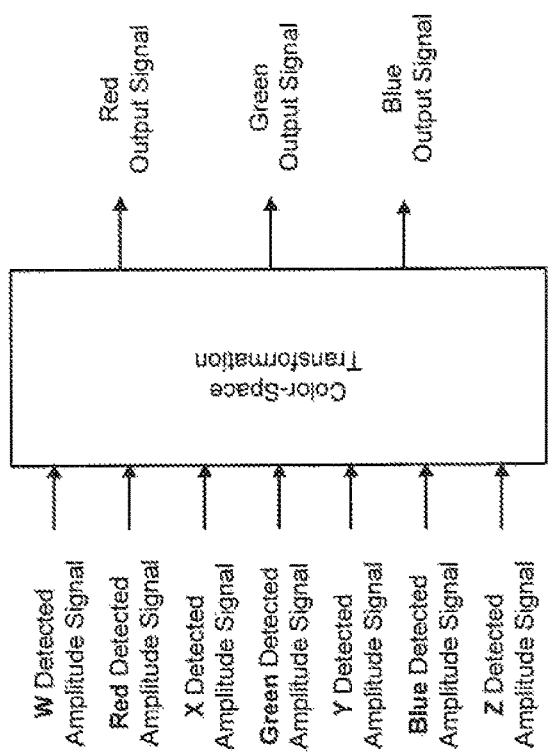
FIG. 18 depicts a color-space transformation that can be applied to signals produced by the exemplary color sensing arrangement of FIG. 15 and the exemplary color band transformation arrangement of FIG. 16 so as to implement a higher-precision color sensing system.

FIG. 18 depicts a color-space transformation that can be applied to signals produced by the exemplary color sensing arrangement of FIG. 15 and the exemplary color band transformation arrangement of FIG. 16 so as to implement a higher-precision color sensing system. In an embodiment, the color-space transformation is a linear transformation. In an embodiment, the color-space transformation is optimized to best approximate the spectral sensitivities of the red, green, and blue cones of human vision. In an embodiment, the color-space transformation is optimized to best approximate the chain beginning with the spectral sensitivities of the red, green, and blue cones of human vision and the spectral placement of the red, green, and blue light emissions in a display. In an embodiment, amplitudes of the signals produced by individual color sensors are adjusted prior to summing in a manner analogous to that depicted in FIG. 9 for a three-color sensing system. In an embodiment, passive or active local interfacing electronics to combine signals from additional inorganic LEDs, OLEDs, or related devices providing additional wavelength sensing bands with signals from other inorganic LEDs, OLEDs, or related devices can be proximate to or integrated in with a cluster of associated inorganic LEDs, OLEDs, or related devices.

In one or more embodiments, nonlinear operations are applied to the signals produced by individual color sensors prior to summing in a manner analogous to that depicted in FIG. 10 for a three-color sensing system. In an embodiment, nonlinear operations are applied to the signals produced by individual color sensors are made after summing as well as prior to summing in a manner analogous to that depicted in FIG. 11 for a three-color sensing system. In an embodiment, passive or active local interfacing electronics can provide nonlinear operations on signals from other inorganic LEDs, OLEDs, or related devices can be proximate to or integrated in with a cluster of associated inorganic LEDs, OLEDs, or related devices.

In one or more embodiments, a separate (scalar) "gamma correction" operation for each color is applied to each the signals produced by individual color sensors prior to summing in a manner analogous to that depicted in FIG. 12 for a three-color sensing system. In an embodiment, a separate (scalar) "gamma correction" operation for each closely approximated red, green, and blue color signal produced by the color-space transformation depicted in FIG. 18 using the three-color scalar "gamma correction" arrangement depicted in FIG. 12.

In one or more embodiments, a combined (vector) "gamma correction" operation is applied to each the signals produced by individual color sensors prior to summing in a manner analogous to that depicted in FIG. 13 for a three-color sensing system. In an embodiment, a combined (vector) "gamma correction" operation is applied to collection of closely approximated red, green, and blue color signals produced by the color-space transformation depicted in FIG. 18 using the three-color vector "gamma correction" arrangement depicted in FIG. 13.

Figure 19:
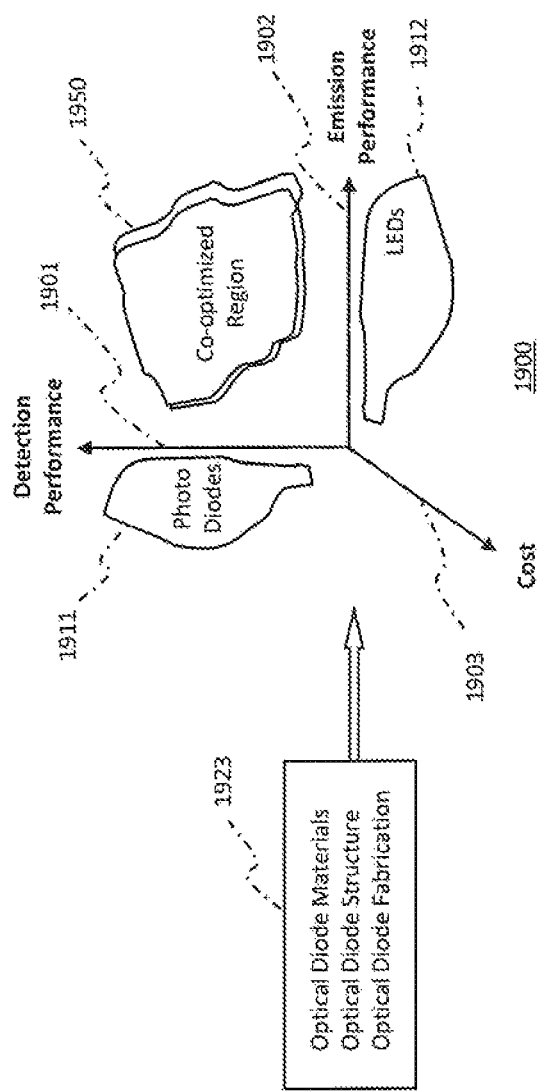
FIG. 19 depicts an exemplary metric space of device realizations for optoelectronic devices and regions of optimization and co-optimization.

Co-Optimization of Light Sensing and Light Emitting Capabilities of an Optical Diode Element FIG. 19 depicts an exemplary metric space 1900 of device realizations for optoelectronic devices and regions of optimization and co-optimization.

Specific optoelectrical diode materials, structure, and fabrication approaches 1923 can be adjusted to optimize a resultant optoelectrical diode for light detection performance 1901 (for example via a P-I-N structure comprising a layer of intrinsic semiconducting material between regions of n-type and p-type material versus light emission performance 1902 versus cost 1903. Optimization within the plane defined by light detection performance 1901 and cost 1903 traditionally result in photodiodes 1911 while optimization within the plane defined by light emission performance 1902 and cost 1903 traditionally result in LEDs 1912. The present invention provides for specific optoelectrical diode materials, structure, and fabrication approaches 1923 to be adjusted to co-optimize an optoelectrical diode for both good light detection performance 1901 and light emission performance 1902 versus cost 1903. A resulting co-optimized optoelectrical diode can be used for multiplexed light emission and light detection modes. These permit a number of applications as explained in the sections to follow.

Stacked OLEDs ("SOLED") as Optical Diode Elements

Figure 20:
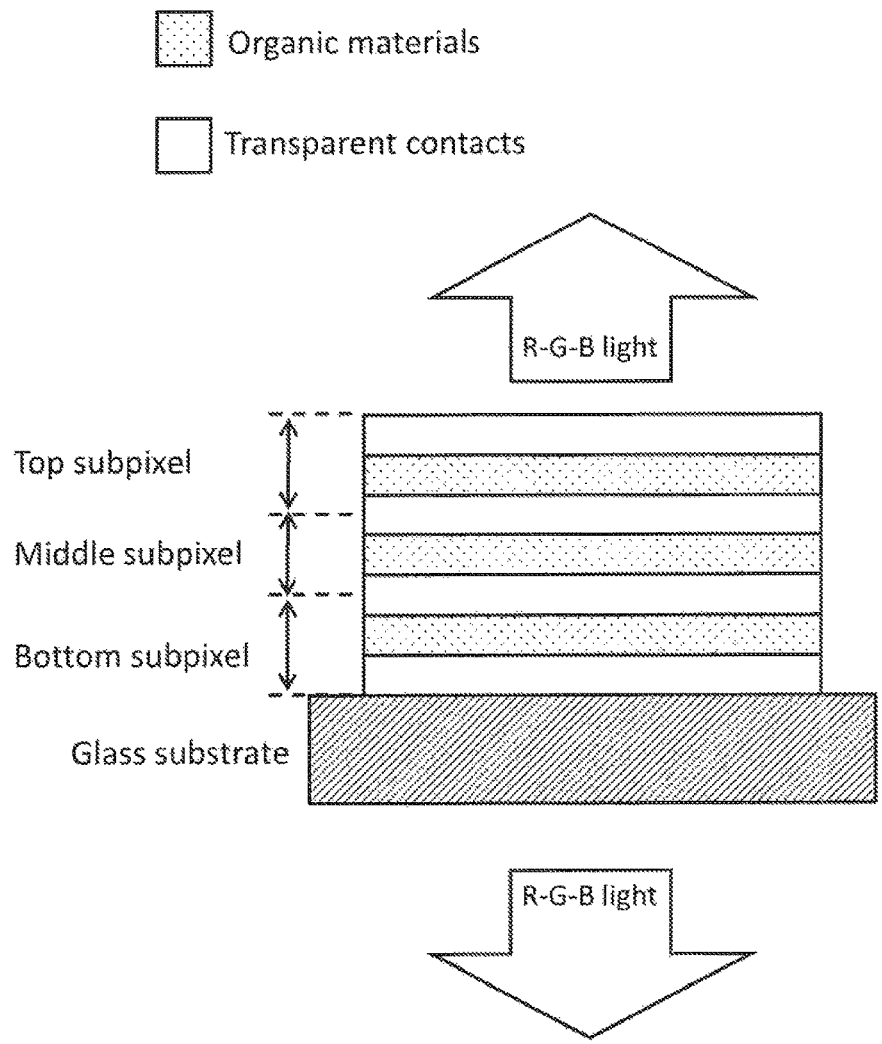
FIG. 20 depicts an exemplary high-level structure of a three-color transparent Stacked OLED ("SOLED") element as can be used for color light emission, color light sensing, or both. (Adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075.)
Figure 21:
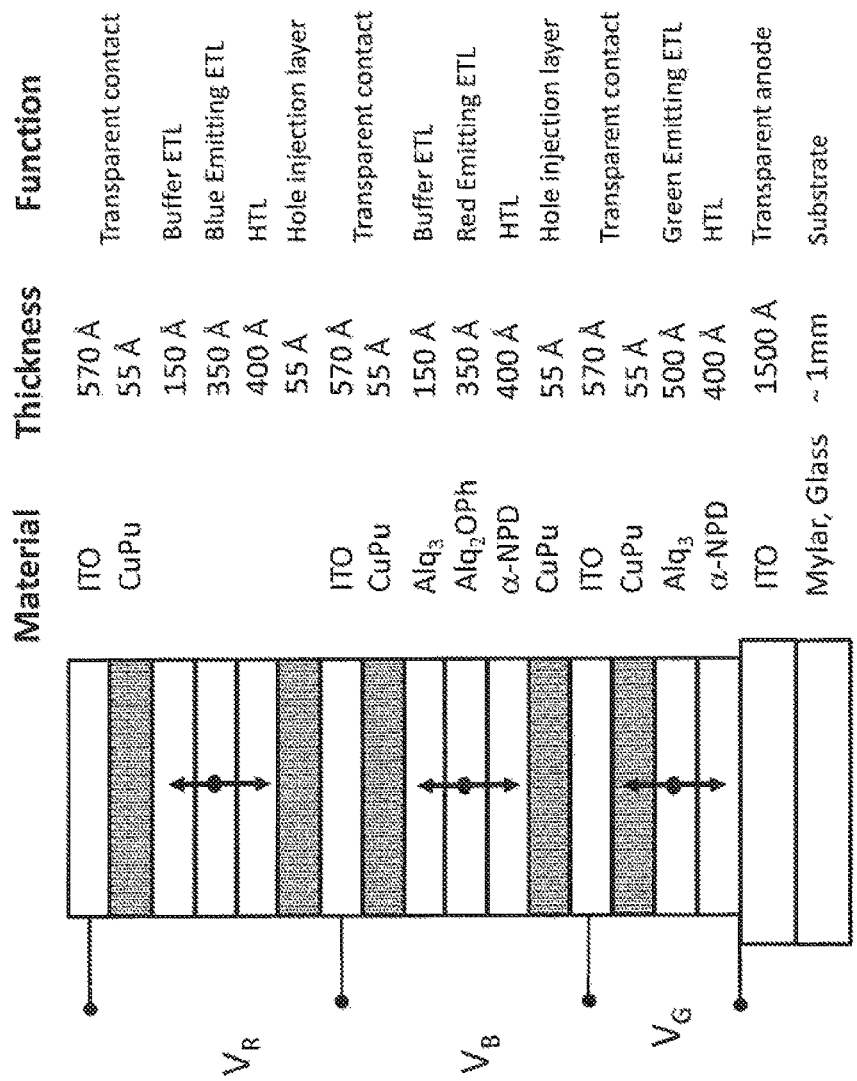
FIG. 21 depicts an exemplary more detailed structure of a three-color transparent SOLED element as can be used for color light emission, color light sensing, or both. (Adapted from G. Gu, G. Parthasarathy, P. Burrows, T. Tian, I. Hill, A. Kahn, S. Forrest, "Transparent stacked organic light emitting devices. I. Design principles and transparent compound electrodes," *Journal of Applied Physics,* October 1999, vol. 86 no. 8, pp. 4067-4075.)

FIG. 20 (adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts an exemplary high-level structure of a three-color transparent Stacked OLED ("SOLED") element as has been developed for use in light-emitting color displays. FIG. 21 (adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts an exemplary more detailed structure of such a three-color transparent SOLED element.

Various aspects of the invention provide for a three-color transparent SOLED element such as those depicted in FIGS. 20-21 or of other forms developed for use in light-emitting color displays to be used as-is as a color transparent light sensor.

Alternatively, the various aspects of the invention provide for analogous structures to be used to implement a three-color transparent light sensor, for example by replacing optoelectrical diode materials, structure, and fabrication approaches 1923 optimized for light emission performance 1902 with optoelectrical diode materials, structure, and fabrication approaches 1923 optimized for light detection performance 1901.

Various aspects of the invention further provide for analogous structures to be used to implement additional colors in such a color transparent light sensor, for example, by the addition of additional groups of layers for optoelectrical diodes. As an example, the aspects of the present invention provide for analogous SOLED component structures to be used to implement a seven-color transparent light sensor for use for example in the exemplary arrangement described in conjunction with FIGS. 14-18. Such a seven-color transparent light sensor can be analogously implemented, for example, by the addition of additional groups of layers for optoelectrical diodes emitting LED colors W, X, Y, and Z as defined in the exemplary arrangement described in conjunction with FIGS. 14-18. This permits OLED elements in arrays such as those depicted in FIGS. 20-21 or of other forms developed for use in light-emitting color displays to be used for light field sensing with very high-performance color accuracy in accordance with aspects of the present invention.

Various aspects of the invention additionally provide for a three-color transparent SOLED element such as those depicted in FIGS. 20-21 or of other forms developed for use in light-emitting color displays to employ specific optoelectrical diode materials, structure, and fabrication approaches 1923 to be adjusted to co-optimize an optoelectrical diode for both good light detection performance 1901 and light emission performance 1902 versus cost 1903. The resulting structure can be used for color light emission, color light sensing, or both.

Arrayed OLEDs as Optical Diode Elements for Use in the Invention

Figure 22:
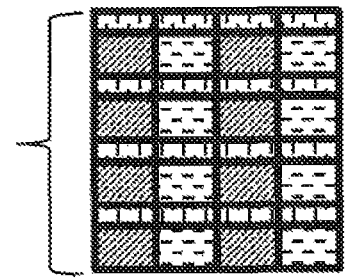
FIG. 22 depicts a conventional "RGB stripe" OLEO array as used in a variety of OLEO display products and as can be used for light field sensing in accordance with aspects of the present invention. (Adapted from http://www.displayblog. com/2009/03/26/samsung-oled-pentile-matrix-next-iphone-oled-display/ (visited Mar. 23, 2011.)

FIG. 22 (adapted from http://www.displayblog.com/2009/03/26/samsung-oled-pentile-matrix-next-iphone-oled-display/ (visited Mar. 23, 2011) depicts a conventional "RGB stripe" OLED array as used in a variety of OLED display products.

Figure 23:
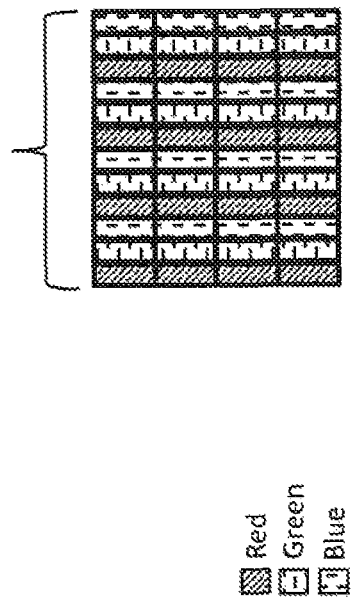
FIG. 23 depicts a representation of the "PenTile Matrix" OLEO array as attributed to Samsung and as can be used for light field sensing in accordance with aspects of the present invention. (Adapted from http://www.displayblog.com/2009/03/26/samsung-oled-pentile-matrix-next-iphone-oled-display/ (visited Mar. 23, 2011.)

FIG. 23 (also adapted from http://www.displayblog.com/2009/03/26/samsung-oled-pentile-matrix-next-iphone-oled-display/ (visited Mar. 23, 2011) depicts a representation of the "PenTile Matrix" OLED array as attributed to Samsung which provides good display performance with a 33% reduction in pixel element count.

Various aspects of the invention provide for arrays of OLED elements such as those depicted in FIGS. 22-23 or of other forms developed for use in light-emitting color displays to be used as-is as a color light sensors. This permits OLED elements in arrays such as those depicted in FIGS. 22-23 or of other forms developed for use in light-emitting color displays to be used for light field sensing in accordance with aspects of the present invention.

Alternatively, the various aspects of the invention provides for analogous structures to be used to implement a three-color transparent light sensor, for example by replacing optoelectrical diode materials, structure, and fabrication approaches 1923 optimized for light emission performance 1902 with optoelectrical diode materials, structure, and fabrication approaches 1923 optimized for light detection performance 1901.

Various aspects of the invention further provide for analogous structures to be used to implement additional colors in such a color transparent light sensor, for example, by the addition of additional optoelectrical diode pixel elements. As an example, the aspects of the present invention provide for analogous structures to be used to implement a seven-color transparent light sensor for use for example in the exemplary arrangement described in conjunction with FIGS. 14-18. This permits OLED elements in arrays such as those depicted in FIGS. 22-23 or of other forms developed for use in light-emitting color displays to be used for light field sensing with very high-performance color accuracy in accordance with aspects of the present invention.

Various aspects of the invention additionally provide for OLED elements in arrays such as those depicted in FIGS. 20-21 or of other forms developed for use in light-emitting color displays to employ specific optoelectrical diode materials, structure, and fabrication approaches 1923 to be adjusted to co-optimize an optoelectrical diode for both good light detection performance 1901 and light emission performance 1902 versus cost 1903. The resulting structure can be used for color light emission, color light sensing, or both.

Color Light Field Sensor Embodiments

In one or more embodiments, various materials, physical processes, structures, and fabrication techniques used in creating an array of color inorganic LEDs, OLEDs, or related devices and associated co-located electronics (such as FETs, resistors, and capacitors) can be used as-is to create an array of color inorganic LEDs, OLEDs, or related devices well-suited as a color light-field sensor. An exemplary general framework underlying such an arrangement is described in U.S. Patent Application Publication No. 2009/0231474 (priority date Jan. 27, 1999) and in the aforesaid U.S. Patent Application Publication No. 2009/0290034.

In one or more embodiments, various materials, physical processes, structures, and fabrication techniques used in creating an array of color inorganic LEDs, OLEDs, or related devices and associated co-located electronics (such as FETs, resistors, and capacitors) can be co-optimized to create an array of color inorganic LEDs, OLEDs, or related devices well-suited as a color light-field sensor. An exemplary general framework underlying such an arrangement is described in U.S. Patent Application Publication No. 2009/0231474 (priority date Jan. 27, 1999) and in the aforesaid U.S. Patent Application Publication No. 2009/0290034.

In one or more embodiments, at least three inorganic LEDs, OLEDs, or related devices are transparent. In an embodiment, the at least three transparent inorganic LEDs, OLEDs, or related devices are comprised in an array that is overlaid on a display such as an LCD.

Use in Implementing a Lensless Imaging Camera

In one or more embodiments, various materials, physical processes, structures, and fabrication techniques used in creating an array of color inorganic LEDs, OLEDs, or related devices and associated co-located electronics (such as FETs, resistors, and capacitors) can be used as-is, adapted, and/or optimized so as to create an array of color inorganic LEDs, OLEDs, or related devices that is well-suited as for operation as a color lensless imaging camera according to the general framework described in pending U.S. Patent Application Publication No. 2009/0231474 and in the aforesaid U.S. Patent Application Publication No. 2009/0290034.

Operation as a Combination Light Field Sensor and Display

In one or more embodiments, each inorganic LED, OLED, or related device in an array of color inorganic LEDs, OLEDs, or related devices can be alternately used as a photodetector or as a light emitter. The state transitions of each inorganic LED, OLED, or related device in the array of color inorganic LEDs, OLEDs, or related devices among the above states can be coordinated in a wide variety of ways to afford various multiplexing, signal distribution, and signal gathering schemes as can be advantageous. An exemplary general framework underlying such an arrangement is described in U.S. Patent Application Publication No. 2009/0231474 and in the aforesaid U.S. Patent Application Publication No. 2009/0290034.

In one or more embodiments, each inorganic LED, OLED, or related device in an array of inorganic LEDs, OLEDs, or related devices can, at any one time, be in one of three states:

A light emission state,
A light detection state,
An idle state, as can be advantageous for various operating strategies. The state transitions of each inorganic LED, OLED, or related device in the array of color inorganic LEDs, OLEDs, or related devices among the above states can be coordinated in a wide variety of ways to afford various multiplexing, signal distribution, and signal gathering schemes as can be advantageous. An exemplary general framework underlying such an arrangement is described in U.S. Patent Application Publication No. 2009/0231474 and in the aforesaid U.S. Patent Application Publication No. 2009/0290034.

Accordingly, in one or more embodiments, various materials, physical processes, structures, and fabrication techniques used in creating an array of color inorganic LEDs, OLEDs, or related devices and associated co-located electronics (such as FETs, resistors, and capacitors) can be used as-is, adapted, and/or optimized so that the array of color inorganic LEDs, OLEDs, or related devices to work well as both a color image display and color light-field sensor. An exemplary general framework underlying such an arrangement is described in U.S. Patent Application Publication No. 2009/0231474 and in the aforesaid U.S. Patent Application Publication No. 2009/0290034.

Use in Implementing a Combination Color Lensless Imaging Camera and Color Visual Display In one or more embodiments, an array of color inorganic LEDs, OLEDs, or related devices, together with associated signal processing aspects of the invention, can be adapted to function as both a color image display and color light-field sensor compatible with synthetic optics image formation algorithms using methods, systems, and process such as those described in pending U.S. patent application Ser. No. 12/419,229, published as U.S. 2009/0231474 (priority date Jan. 27, 1999) and in the aforesaid U.S. Patent Application Publication No. 2009/0290034.

Use in Implementing a Tactile Gesture User Interface Sensor

In one or more embodiments, an array of color inorganic LEDs, OLEDs, or related devices, together with associated signal processing aspects of the invention, can be used to implement a tactile user interface sensor as, for example, taught in Han U.S. Pat. No. 7,598,949, incorporated herein by reference.

Use in Implementing a Proximate Gesture User Interface Sensor

In one or more embodiments, an array of color inorganic LEDs, OLEDs, or related devices, together with associated signal processing aspects of the invention, can be adapted to function as both an image display and light-field sensor which can be used to implement a proximate image user interface sensor as, for example, replacing the photodiode sensor arrangement used in the M.I.T. BI-DI user interface. In one approach, the M.I.T. BI-DI photodiode sensor arrangement behind the LCD array can be replaced with an array of inorganic LEDs, OLEDs, or related devices as provided for in the current invention. In another approach, the M.I.T. BI-DI photodiode sensor arrangement behind the LCD array, the LCD itself, and the associated backlight can be replaced with an array of inorganic LEDs, OLEDs, or related devices as provided for in the current invention.

Use in Implementing a Combination Tactile Gesture User Interface Sensor and Color Visual Image Display In one or more embodiments, an array of color inorganic LEDs, OLEDs, or related devices, together with associated signal processing aspects of the invention, can be adapted to function as both a color image display and color light-field sensor which can be used to implement a tactile user interface sensor as, for example, taught in Han U.S. Pat. No. 7,598,949, and also as a visual display. An exemplary general framework underlying such an arrangement is described in pending U.S. Patent Application 61/363,181.

Use in Implementing a Combination Proximate Gesture User Interface Sensor and Visual Image Display In one or more embodiments, an array of color inorganic LEDs, OLEDs, or related devices, together with associated signal processing aspects of the invention, can be adapted to function as both an image display and light-field sensor which can be used to implement a proximate image user interface sensor as, for example, replacing the photodiode sensor and LCD display arrangement used in the M.I.T. BI-DI user interface. In an embodiment an array of inorganic LEDs, OLEDs, or related devices can be adapted to function as both an image display and light-field sensor which can be used to implement a tactile user interface sensor as, for example, taught in Han U.S. Pat. No. 7,598,949, and also as a visual display. An exemplary general framework underlying such an arrangement is described in pending U.S. Patent Application 61/363,181.

Use in Implementing a Combination Gesture User Interface Sensor, Lensless Imaging Camera, and Visual Image Display In one or more embodiments, an array of color inorganic LEDs, OLEDs, or related devices, together with the associated signal processing aspects of the invention, can be adapted to function as both an image display and light-field sensor which can be used to implement a gesture user interface sensor, lensless imaging camera, and visual image display. An exemplary general framework underlying such an arrangement is described in pending U.S. Patent Application 61/363,181.

Closing

Although the present invention has been described in connection with particular preferred embodiments and examples, it is to be understood that many modifications and variations can be made in hardware, software, operation, uses, protocols and data formats without departing from the scope to which the inventions disclosed herein are entitled. Specifically, the signal processing operations described herein may be performed using a specialized circuitry or software executing on an appropriate hardware platform. In addition, various aspects and/or components of the described embodiments may be used singly or in any combination in the system for sensing light. Accordingly, the present invention is to be considered as including all apparatus and methods encompassed by the appended claims.

What is claimed is:

1. A light-sensor array system for sensing a multiple-color image without the use of visible-band wavelength-selective optical elements, the light-sensor array system comprising:
    a light-sensor array comprising a plurality of visible-band light-sensing pixels, each visible-band light-sensing pixel comprising:
        at least three wavelength-selective light-sensing opto-electronic elements, each of the at least three wavelength-selective light-sensing opto-electronic elements comprising a light-sensing region and configured to produce wavelength-selective electrical responses to a particular range of wavelengths of visible-band light incident on the light-sensing region, each of the at least three wavelength-selective light-sensing opto-electronic elements having a different wavelength-selective electrical response characteristic from the other two wavelength-selective light-sensing opto-electronic elements,
    wherein each of the plurality of visible-band light-sensing pixels is configured to produce an electrical output from each of the at least three wavelength-selective light-sensing opto-electronic elements comprising the visible-band light-sensing pixel,
    signal processing responsive to the electrical output produced by each of the plurality of visible-band light-sensing pixels, the signal processing producing at least three measurement signals corresponding to color components of the visible-band light incident on the light-sensing region of the visible-band light-sensing pixel.

2. The light-sensor array system of claim 1, wherein the at least three wavelength-selective light-sensing opto-electronic elements are adjacently located within each visible-band light-sensing pixel.

3. The light-sensor array system of claim 1, wherein the at least three wavelength-selective light-sensing opto-electronic elements are arranged in the form of a stacked array.

4. The light-sensor array system of claim 1, wherein the at least three wavelength-selective light-sensing opto-electronic elements are arranged as stacked organic light emitting diode (SOLED).

5. The light-sensor array system of claim 1, wherein each visible-band light-sensing pixel comprises more than three wavelength-selective light-sensing opto-electronic elements, and
    at least two color components are represented by the plurality of measurement signals.

6. The light-sensor array system of claim 1, wherein at least one of the at least three measurement signals responds linearly to variations in light amplitude for light of an individual wavelength.

7. The light-sensor array system of claim 1, wherein the light-sensor array is configured to emit light.

8. The light-sensor array system of claim 1, wherein of some of the wavelength-selective light-sensing opto-electronic elements are co-optimized for both light sensing and light emission.

9. The light-sensor array system of claim 1, wherein some of the wavelength-selective light-sensing opto-electronic elements are light-emitting diodes (LEDs).

10. The light-sensor array system of claim 1, wherein some of the wavelength-selective light-sensing opto-electronic elements are organic light-emitting diodes (OLEDs).

11. The light-sensor array system of claim 1, wherein the light-sensor array can operate as a visual display.

12. The light-sensor array system of claim 1, wherein the light-sensor array is configured to operate as a color visual display.

13. The light-sensor array system of claim 1, wherein the wavelength-selective light-sensing opto-electronic elements are transparent.

14. The light-sensor array system of claim 1, wherein the wavelength-selective light-sensing opto-electronic elements are deposited on a transparent material.

15. The light-sensor array system of claim 1, wherein the light-sensor array is transparent.

16. The light-sensor array system of claim 1, wherein the light-sensor array is bendable.

17. The light-sensor array system of claim 1, wherein wavelength-selective light-sensing opto-electronic elements employ a semiconducting band-gap to implement wavelength-selectivity.

18. The light-sensor array system of claim 1, wherein the light-sensor array is provided with an ultra-violet (UV) light filter.

19. The light-sensor array system of claim 1, wherein the light-sensor array is fabricated using printing methods.

20. The light-sensor array system of claim 1, wherein the light-sensor array is implemented on a curved surface.

21. The light-sensor array system of claim 1, wherein the light-sensor array comprises semiconductor materials which are deposited as semiconductor inks.

* * * * *